United States Patent
Kim

(10) Patent No.: US 11,604,099 B2
(45) Date of Patent: Mar. 14, 2023

(54) LONG-WAVE INFRARED DETECTING ELEMENT, ARRAY STRUCTURE OF LONG-WAVE INFRARED DETECTING ELEMENTS, LONG-WAVE INFRARED TEMPERATURE DETECTING DEVICE, AND THERMAL IMAGING DEVICE

(71) Applicant: SAMSUNG ELECTRONICS CO., LTD., Suwon-si (KR)

(72) Inventor: Dongkyun Kim, Suwon-si (KR)

(73) Assignee: SAMSUNG ELEOTRONICC CO., LTD, Suwon-si (KR)

( * ) Notice: Subject to any disclaimer, the term of this patent is extended or adjusted under 35 U.S.C. 154(b) by 0 days.

(21) Appl. No.: 17/479,682

(22) Filed: Sep. 20, 2021

(65) Prior Publication Data
US 2022/0178757 A1    Jun. 9, 2022

(30) Foreign Application Priority Data
Dec. 4, 2020    (KR) .................. 10-2020-0168727

(51) Int. Cl.
*G01J 5/10* (2006.01)
*G01J 5/00* (2022.01)

(52) U.S. Cl.
CPC ......... *G01J 5/10* (2013.01); *G01J 2005/0077* (2013.01)

(58) Field of Classification Search
CPC ........................ G01J 5/10; G01J 2005/0077
See application file for complete search history.

(56) References Cited

U.S. PATENT DOCUMENTS 2,222,425 A    11/1940    Wehe
3,513,313 A    5/1970    Schwartz
(Continued)

FOREIGN PATENT DOCUMENTS

| JP | 2593939 B2 | 3/1997 |
|---|---|---|
| JP | 2000-047083 A | 2/2000 |
| KR | 10-1594256 B1 | 2/2016 |

OTHER PUBLICATIONS

Chen et al., "Energy levels in Silicon", 1980, Annu. Rev. Mater. Sci., vol. 10, 73 pages total.
(Continued)

*Primary Examiner* — Hugh Maupin
(74) *Attorney, Agent, or Firm* — Sughrue Mion, PLLC

(57) ABSTRACT

Provided is a long-wave infrared detecting element including a magnetic field generator configured to generate a magnetic field, a substrate provided on the magnetic field generator, a magnetic-electric converter that is spaced apart from the substrate and configured to generate an electrical signal based on the magnetic field generated by the magnetic field generator, and an support unit that is provided on the substrate and supports the magnetic-electric converter in a state in which the magnetic-electric converter is spaced apart from the substrate, the support unit being configured to generate heat by absorbing incident infrared radiation, wherein the electrical signal changes corresponding to temperature changes of the magnetic-electric converter based on the incident infrared radiation directly absorbed in the magnetic-electric converter and temperature changes of the magnetic-electric converter based on the incident infrared radiation absorbed in the support unit.

27 Claims, 26 Drawing Sheets

(56) References Cited

U.S. PATENT DOCUMENTS

| | | |
|---|---|---|
| 3,727,053 A | 4/1973 | Walser et al. |
| 2013/0044787 A1* | 2/2013 | Kirihara .................. H01L 27/22 |
| | | 374/E7.039 |
| 2019/0120712 A1 | 4/2019 | White et al. |

OTHER PUBLICATIONS

Anonymous, "Lecture 7: Extrinsic semiconductors—Fermi level", 2020, NOC: Fundamentals of electronic materials and devices, 10 pages total.

Yoshida et al., "Construction of magnetic infrared sensor utilizing ferromagnetic film" Sep. 1999, IEEE Transactions on Magnetics, vol. 35, Issue 5, 3 pages total.

\* cited by examiner

FIG. 14

| $N_d$ [cm$^{-3}$] | $R$ [Ω] | $\partial S_V / \partial T$ [%/K] |
|---|---|---|
| 1e8 | 5.86e8 | −0.81 |
| 1e10 | 4.04e8 | −1.32 |
| 1e12 | 6.69e6 | −0.79 |
| 1e14 | 6.75e4 | −0.79 |
| 1e16 | 8.22e2 | −0.64 |
| 1e18 | 4.57e1 | −0.18 |

FIG. 17

| Dopant | $E_d$ [meV] | $n$ [cm$^{-3}$] | $\rho$ [Ω*cm] | $\partial S_I / \partial T$ [%/K] |
|---|---|---|---|---|
| P | 45 | 9.62e16 | 0.092 | −0.038 |
| Bi | 72 | 9.07e16 | 0.097 | −0.121 |
| N | 140 | 5.35e16 | 0.16 | −0.73 |
| S | 180 | 3.02e16 | 0.29 | −1.163 |
| Ti | 210 | 1.83e16 | 0.48 | −1.442 |
| C | 250 | 0.89e16 | 0.99 | −1.777 |

LONG-WAVE INFRARED DETECTING ELEMENT, ARRAY STRUCTURE OF LONG-WAVE INFRARED DETECTING ELEMENTS, LONG-WAVE INFRARED TEMPERATURE DETECTING DEVICE, AND THERMAL IMAGING DEVICE

CROSS-REFERENCE TO RELATED APPLICATION

This application claims priority to Korean Patent Application No. 10-2020-0168727, filed on Dec. 4, 2020, in the Korean Intellectual Property Office, the disclosure of which is incorporated by reference herein in its entirety.

BACKGROUND

1. Field

Example embodiments of the present disclosure relate to a long-wave infrared detecting element, a long-wave infrared detecting element array structure, a long-wave infrared temperature detecting device, and a thermal imaging device, and more particularly, to a long-wave infrared detecting element, a long-wave infrared detecting element array structure, a long-wave infrared temperature detecting device, and a thermal imaging device that are configured to generate an electrical signal in proportion to absorbed infrared radiation.

2. Description of Related Art

Uncooled infrared detecting devices are widely used to detect infrared radiation. Such uncooled infrared detecting devices may be classified into a bolometer type that uses a change in the electrical resistance of a material according to the temperature change of the material due to infrared absorption changes, a pyroelectric type that uses a change in the spontaneous polarization of the pyroelectric ceramic according to the amount of temperature change due to infrared absorption changes, a thermopile type that uses an electro-motive force across two contacts of an electrically conducting material when there is a temperature difference between those two contacts due to infrared absorption changes, and the like.

Various types of infrared detecting devices have been used in various fields such as non-contact temperature sensors, military night vision goggles, automotive night vision devices, and medical thermal imaging cameras. To this end, there is a need for an uncooled infrared detecting device which is small and light for portability and has characteristics such as low power consumption, low price, and fast response at room temperature.

SUMMARY

One or more example embodiments provide long-wave infrared detecting elements, long-wave infrared detecting element array structures, long-wave infrared temperature detecting devices, and thermal imaging devices that are configured to detect infrared radiation by using a thermo-electromagnetic detector in which an electrical output signal changes with temperature caused by infrared absorption under a constant magnetic field.

One or more example embodiments also provide long-wave infrared detecting elements having a structure in which incident infrared radiation is efficiently converted into electrical energy by a thermo-electromagnetic detector; long-wave infrared detecting element array structures including the long-wave infrared detecting elements; long-wave infrared temperature detecting devices including the long-wave infrared detecting elements; and thermal imaging devices including the long-wave infrared detecting elements.

Additional aspects will be set forth in part in the description which follows and, in part, will be apparent from the description, or may be learned by practice of example embodiments.

According to an aspect of an example embodiment, there is provided a long-wave infrared detecting element including a magnetic field generator configured to generate a magnetic field, a substrate provided on the magnetic field generator, a magnetic-electric converter that is spaced apart from the substrate and configured to generate an electrical signal based on the magnetic field generated by the magnetic field generator, and an support unit that is provided on the substrate and supports the magnetic-electric converter in a state in which the magnetic-electric converter is spaced apart from the substrate, the support unit being configured to generate heat by absorbing incident infrared radiation, wherein the electrical signal changes corresponding to temperature changes of the magnetic-electric converter based on the incident infrared radiation directly absorbed in the magnetic-electric converter and temperature changes of the magnetic-electric converter based on the incident infrared radiation absorbed in the support unit.

The magnetic-electric converter may include a Hall plate which is conductive, a pair of bias electrodes which are provided at both ends of the Hall plate in a first direction of the Hall plate, and at least one pair of detection electrodes which are provided at both ends of the Hall plate in a second direction of the Hall plate which is perpendicular to the first direction, wherein both the first direction and the second direction are perpendicular to a direction of the magnetic field generated by the magnetic field generator.

The Hall plate may include an extrinsic semiconductor material doped with a dopant.

In a voltage bias mode in which a constant voltage is applied between the pair of bias electrodes, Hall voltage generated in the Hall plate may decrease as a temperature of the Hall plate increases.

A concentration of the dopant may be determined such that in a voltage bias mode in which a constant voltage is applied between the pair of bias electrodes, a rate of change in temperature-dependent Hall voltage generated in the Hall plate is within a range of −0.5%/K to −1.0%/K at room temperature.

The concentration of the dopant may be determined such that the Hall plate has a resistance value of 800Ω to 7000 kΩ at room temperature.

Ionization energy of the dopant may be determined such that in a current bias mode in which a constant current is applied between the pair of bias electrodes, Hall voltage generated in the Hall plate decreases as a temperature of the Hall plate increases in a temperature range of 250 K to 400 K.

The ionization energy of the dopant may be determined such that in the current bias mode in which a constant current is applied between the pair of bias electrodes, a rate of change in temperature-dependent Hall voltage generated in the Hall plate is within a range of −1.0%/K to −2.0%/K at room temperature.

The concentration of the dopant may be within a range of $10^{12}$ cm$^{-3}$ to $10^{17}$ cm$^{-3}$.

A trench may be provided in a portion of the substrate, and the Hall plate is provided above the trench.

The support unit may include a support plate provided above the trench to support the Hall plate, an edge element spaced apart from the support plate and adjacent to the support plate, and at least one connection unit connecting the support plate and the edge element to each other.

Each of the pair of bias electrodes and the at least one pair of detection electrodes may extend in a direction away from the Hall plate, and the at least one connection unit may include a first connection unit, a second connection unit, a third connection unit, and a fourth connection unit which respectively support the pair of bias electrodes and the at least one pair of detection electrodes.

The support plate may include any one of silicon nitride and silicon oxide.

The Hall plate may be provided in a region of the support plate, and the pair of bias electrodes and the at least one pair of detection electrodes may be provided in regions of the support plate, the first to fourth connection units, and the edge element.

The Hall plate may be formed by doping the region of the support plate with a dopant.

The long-wave infrared detecting element may further include an insulating layer provided between the support unit and the substrate.

The support unit may include a support plate supporting the Hall plate, a support pillar protruding from an upper surface of the substrate in a vertical direction, and a connection unit connecting the support plate and an upper portion of the support pillar to each other, wherein the support plate and the support pillar are spaced apart from each other on a plane perpendicular to the vertical direction.

The pair of bias electrodes and the at least one pair of detection electrodes may include a pattern extending from the Hall plate, the connection unit may include a first connection unit, a second connection unit, a third connection unit, and a fourth connection unit which respectively support the pair of bias electrodes and the at least one pair of detection electrodes, and the support pillar may include a first support pillar, a second support pillar, a third support pillar, and a fourth support pillar which are respectively connected to the first connection unit, the second connection unit, the third connection unit, and the fourth connection unit.

The connection unit may have an area less than an area of the support plate.

The pair of bias electrodes and the at least one pair of detection electrodes may include a meander pattern.

The long-wave infrared detecting element may further include a reflecting plate provided on the upper surface of the substrate.

The long-wave infrared detecting element may further include a reference converter which includes a conductive reference plate, an infrared shield layer provided on the reference plate, a pair of bias electrodes provided at both ends of the reference plate in a first direction of the reference plate, and at least one pair of detection electrodes provided at both ends of the reference plate in a second direction of the reference plate which is perpendicular to the first direction, wherein both the first direction and the second direction are perpendicular to the direction of the magnetic field generated by the magnetic field generator, and wherein electrical signals produced by the magnetic-electric converter and the reference converter are differentially amplified by a differential amplifier circuit.

According to another aspect of an example embodiment, there is provided a long-wave infrared detecting element array structure including a plurality of long-wave infrared detecting elements, wherein each of the plurality of long-wave infrared detecting elements include a magnetic field generator configured to generate a magnetic field, a substrate provided on the magnetic field generator, a magnetic-electric converter that is spaced apart from the substrate and configured to generate an electrical signal based on the magnetic field generated by the magnetic field generator, and an support unit that is provided on the substrate and supports the magnetic-electric converter in a state in which the magnetic-electric converter is spaced apart from the substrate, the support unit being configured to generate heat by absorbing incident infrared radiation, wherein the electrical signal changes corresponding to temperature changes of the magnetic-electric converter based on the incident infrared radiation directly absorbed in the magnetic-electric converter and temperature changes of the magnetic-electric converter based on the incident infrared radiation absorbed in the support unit.

The magnetic field generator and the substrate may be provided in one piece.

According to another aspect of an example embodiment, there is provided a long-wave infrared temperature detecting device including a long-wave infrared detecting element configured to absorb incident infrared radiation and detect an electrical signal varying based on the incident infrared radiation, a signal processor configured to process the electrical signal received from the long-wave infrared detecting element, and a display device configured to display an image generated by the electrical signal processed by the signal processor, wherein the long-wave infrared detecting element includes a magnetic field generator configured to generate a magnetic field, a substrate provided on the magnetic field generator, a magnetic-electric converter that is spaced apart from the substrate and configured to generate the electrical signal based on the magnetic field generated by the magnetic field generator, and an support unit that is provided on the substrate and supports the magnetic-electric converter in a state in which the magnetic-electric converter is spaced apart from the substrate, the support unit is configured to generate heat by absorbing the incident infrared radiation, wherein the electrical signal changes corresponding to temperature changes of the magnetic-electric converter based on the incident infrared radiation directly absorbed in the magnetic-electric converter and temperature changes of the magnetic-electric converter based on the incident infrared radiation absorbed in the support unit.

The long-wave infrared temperature detecting device may further include an optical lens that focuses incident infrared light on the long-wave infrared detecting element, an aperture that is provided between the optical lens and the long-wave infrared detecting element and adjusts an amount of the infrared light, and an optical filter that is provided between the optical lens and the long-wave infrared detecting element and configured to remove a wavelength region of the infrared light having passed through the optical lens.

According to another aspect of an example embodiment, there is provided a thermal imaging device including an optical system configured to focus incident infrared rays, a long-wave infrared detecting element array structure that includes a plurality of long-wave infrared detecting elements configured to detect the infrared rays that passes through the optical system, a controller configured to control operations of the plurality of long-wave infrared detecting elements, a signal processor configured to process an electrical signal from the long-wave infrared detecting element array structure, and a display device configured to display an image generated by the electrical signal processed by the signal processor, wherein each of the plurality of long-wave infrared detecting elements includes a magnetic field generator configured to generate a magnetic field, a substrate provided on the magnetic field generator, a magnetic-electric converter that is spaced apart from the substrate and configured to generate an electrical signal based on the magnetic field generated by the magnetic field generator, and an support unit that is provided on the substrate and supports the magnetic-electric converter in a state in which the magnetic-electric converter is spaced apart from the substrate, the support unit being configured to generate heat by absorbing incident infrared radiation, wherein the electrical signal changes corresponding to temperature changes of the magnetic-electric converter based on the incident infrared radiation directly absorbed in the magnetic-electric converter and temperature changes of the magnetic-electric converter based on the incident infrared radiation absorbed in the support unit.

BRIEF DESCRIPTION OF THE DRAWINGS

The above and/or other aspects, features, and advantages of example embodiments will be more apparent from the following description taken in conjunction with the accompanying drawings, in which:

FIG. 14 is a table showing the resistance of the Hall plate of FIG. 2 at room temperature and the rate of change in the voltage-based Hall sensitivity of the Hall plate 11a at room temperature for different dopant concentrations;

FIG. 17 is a table showing the rate of change in the current-based Hall sensitivity of the Hall plate of FIG. 2 at room temperature according to the ionization energy of dopants;

DETAILED DESCRIPTION

Figure 1:
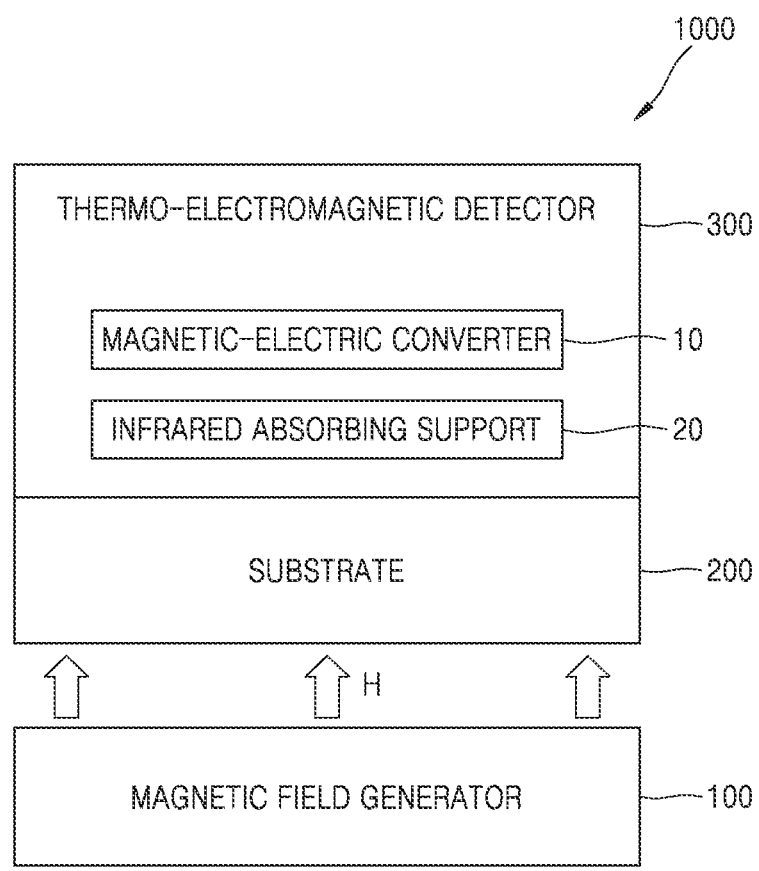
FIG. 1 is a block diagram schematically illustrating an example configuration of a long-wave infrared detecting element according to an example embodiment.

Reference will now be made in detail to example embodiments of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

In the drawings, the size or thickness of each element may be exaggerated for clarity of description.

In the following description, when an element is referred to as being "above" or "on" another element, it may be directly on the other element while making contact with the other element or may be above the other element without making contact with the other element. The terms of a singular form may include plural forms unless otherwise mentioned. It will be further understood that the terms "comprises" and/or "comprising" used herein specify the presence of stated features or elements, but do not preclude the presence or addition of one or more other features or elements.

An element referred to with the definite article or a demonstrative pronoun may be construed as the element or the elements even though it has a singular form. Examples or exemplary terms are just used herein to describe technical ideas and should not be considered for purposes of limitation unless defined by the claims.

It will be understood that although terms such as "first" and "second" are used herein to describe various elements, these elements should not be limited by these terms. Terms are only used to distinguish one element from other elements.

FIG. 1 is a block diagram schematically illustrating an example configuration of a long-wave infrared detecting element 1000 according to an example embodiment.

Referring to FIG. 1, the long-wave infrared detecting element 1000 may include: a magnetic field generator 100 that generates a magnetic field, a substrate 200 that is provided on the magnetic field generator 100, and a thermo-electromagnetic detector 300 that is provided on the substrate 200 to absorb infrared radiation incident from the outside and detect changes in an electrical signal which result from temperature changes caused by the infrared radiation.

The thermal-electromagnetic detector 300 may include a magnetic-electric converter 10 that is spaced apart or separate from the substrate 200 and is configured to generate an electrical signal according to a magnetic field H generated by the magnetic field generator 100, and an support unit 20 that is provided on the substrate 200. The support unit 20 supports the magnetic-electric converter 10 in a state in which the magnetic-electric converter 10 is spaced apart from the substrate 200, and generates heat by absorbing infrared radiation from the outside.

The magnetic field generator 100 may generate a magnetic field H having uniform intensity in a vertical direction. That is, the magnetic field generator 100 may generate a constant magnetic field H. The substrate 200 and the thermal-electromagnetic detector 300 may be sequentially provided on the magnetic field generator 100 in a direction parallel to the direction of the magnetic field H. The magnetic field generator 100 may include, for example, an electromagnet, a permanent magnet, or the like. However, embodiments are not limited thereto, and the magnetic field generator 100 may include any structure capable of generating a magnetic field other than an electromagnet or a permanent magnet.

As shown in FIG. 1, the magnetic field generator 100 may be spaced apart from the substrate 200. However, embodiments are not limited thereto, and the magnetic field generator 100 may be in contact with a lower surface of the substrate 200.

The substrate 200 may be a base layer for forming the thermo-electromagnetic detector 300. The substrate 200 may include, for example, a silicon (Si) substrate. However, embodiments are not limited thereto, and the substrate 200 may include various materials.

The thermal-electromagnetic detector 300 may be configured to convert temperature changes caused by absorbing the infrared radiation incident from the outside into changes in an electrical signal. For example, the thermal-electromagnetic detector 300 may include the magnetic-electric converter 10 which is configured to generate an electrical signal according to a magnetic field H generated by the magnetic field generator 100. The magnetic-electric converter 10 may generate an electrical signal that varies depending on changes in the temperature of the magnetic-electric converter 10 which are caused by incident infrared radiation directly absorbed in the magnetic-electric converter 10 and changes in the temperature of the magnetic-electric converter 10 which are caused by infrared radiation absorbed in the support unit 20.

For example, the magnetic-electric converter 10 may include a Hall sensor capable of detecting an electrical signal using the Hall effect. The Hall sensor may be a device that generates a voltage difference (the Hall voltage) across an electrical conductor (the Hall plate) in a direction perpendicular to both a current in the electrical conductor and an applied magnetic field perpendicular to the current. In this case, the Hall voltage may vary with temperature, depending on the type of material included in the Hall sensor. The structure and function of the Hall sensor will be described later with reference to FIGS. 2 and 5. However, embodiments are not limited thereto, and the magnetic-electric converter 10 may include, for example, a mangetoresistive sensor. The mangetoresistive sensor may have resistance varying with temperature.

In addition, the thermo-electromagnetic detector 300 may include the support unit 20 that supports the magnetic-electric converter 10 in a state in which the magnetic-electric converter 10 is spaced apart from the substrate 200. The support unit 20 may be configured to absorb external infrared radiation. The support unit 20 may transfer thermal energy, which is generated due to the absorbed infrared radiation, to the magnetic-electric converter 10. Because the magnetic-electric converter 10 is spaced apart from the substrate 200 due to the support unit 20, thermal energy of the support unit 20 may more efficiently and quickly heat the magnetic-electricity converter 10. Therefore, the temperature of the magnetic-electric converter 10 may vary in real time. Changes in the temperature of the magnetic-electric converter 10 may cause changes in an electrical signal generated by the magnetic-electric converter 10.

Figure 2:
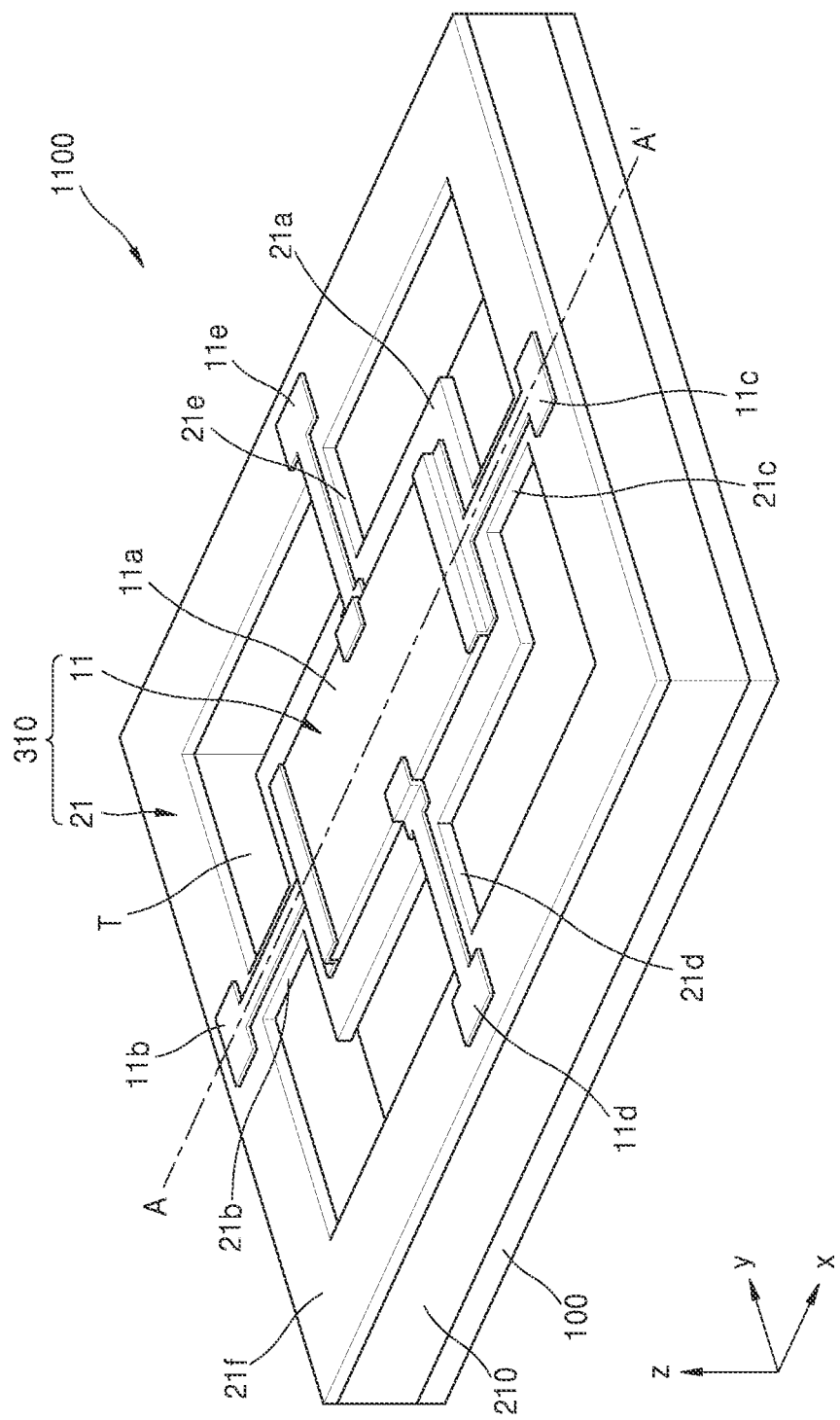
FIG. 2 is a perspective view schematically illustrating an example configuration of a long-wave infrared detecting element according to another example embodiment.
Figure 3:
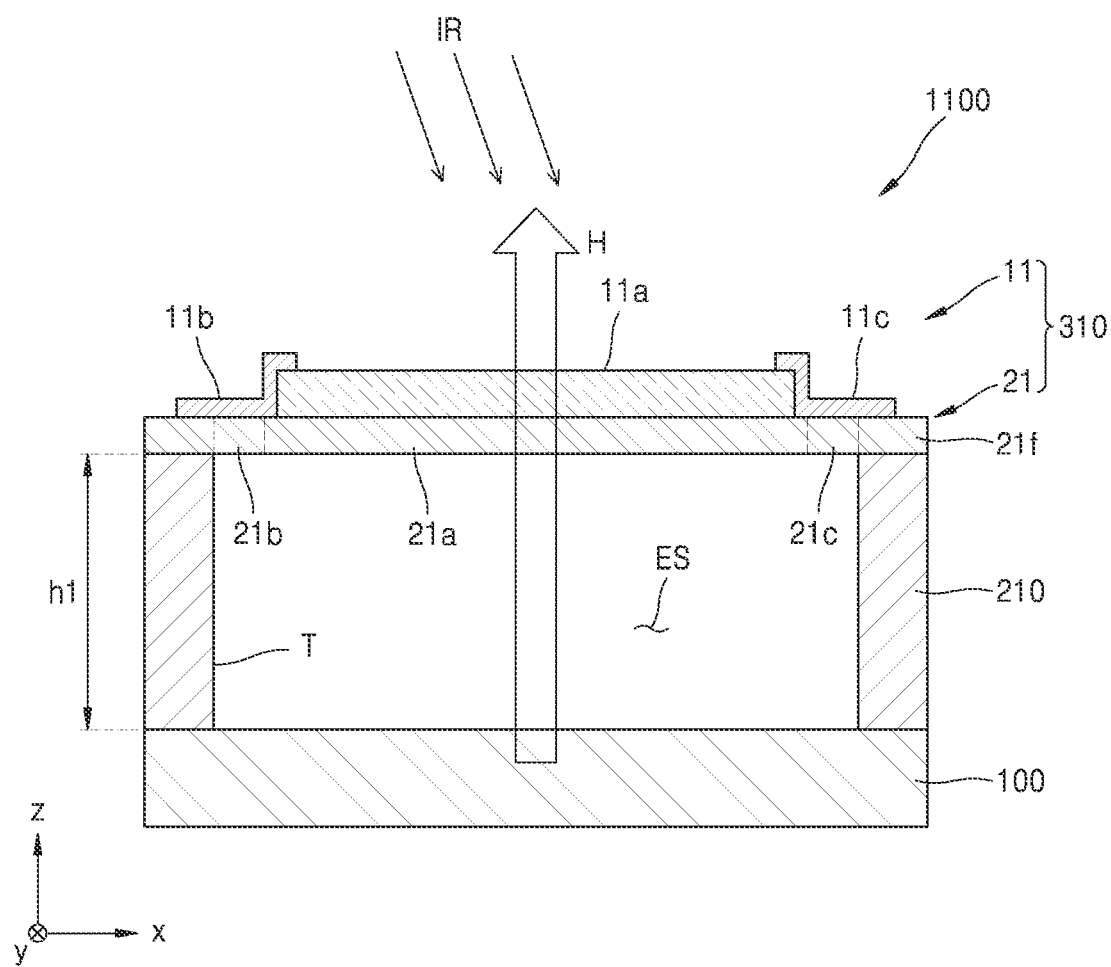
FIG. 3 is a schematic cross-sectional view taken along line A-A' of FIG. 2.
Figure 4:
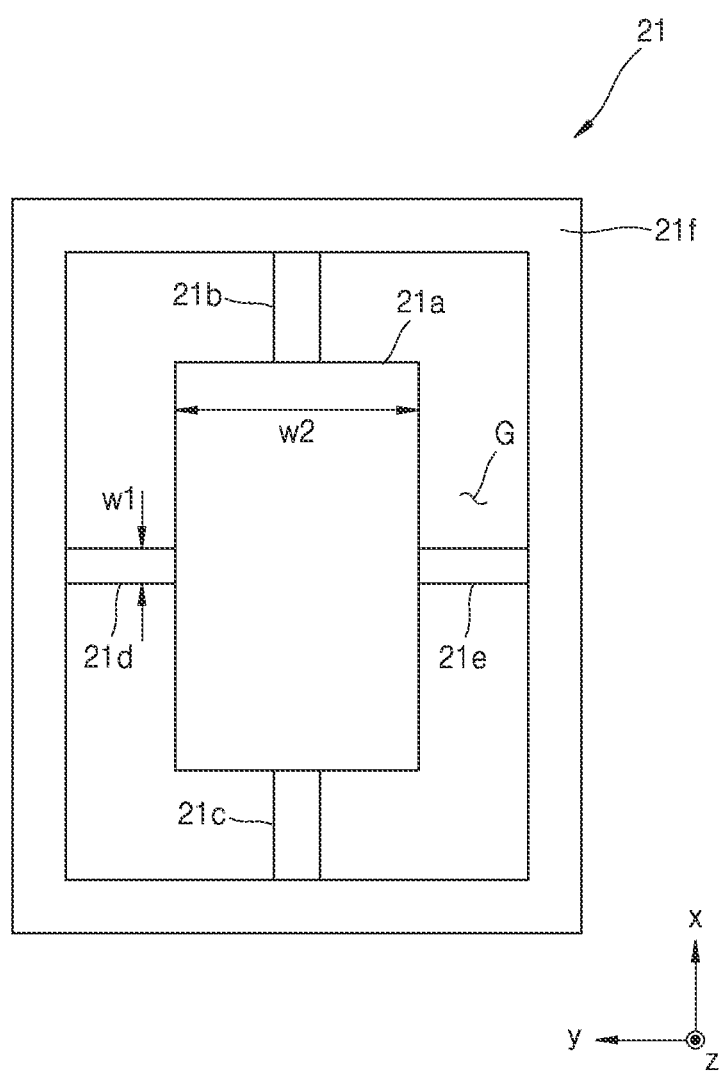
FIG. 4 is a plan view schematically illustrating an example configuration of an support unit included in the long-wave infrared detecting element shown in FIG. 2.
Figure 5:
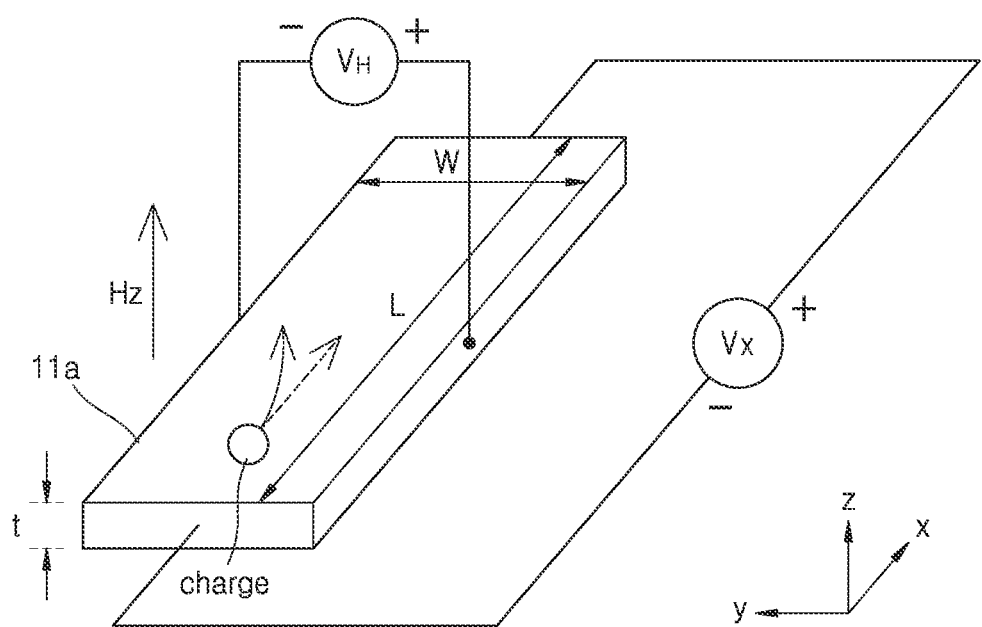
FIG. 5 is a view illustrating the Hall effect.

FIG. 2 is a perspective view schematically illustrating an example configuration of a long-wave infrared detecting element 1100 according to another example embodiment. FIG. 3 is a schematic cross-sectional view taken along line A-A' of FIG. 2. FIG. 4 is a plan view schematically illustrating an example configuration of an support unit 21 included in the long-wave infrared detecting element 1100 shown in FIG. 2. FIG. 5 is a view illustrating the Hall effect.

Referring to FIGS. 2 and 3, the long-wave infrared detecting element 1100 may include a magnetic field generator 100 that generates a magnetic field, a substrate 210 that is provided on the magnetic field generator 100, and a thermo-electromagnetic detector 310 that is provided on the substrate 210 to absorb infrared radiation incident from the outside and detect changes in an electrical signal which result from temperature changes caused by the infrared radiation. The magnetic field generator 100 is the same as that described with reference to FIG. 1. For example, the magnetic field generator 100 may generate a magnetic field H having uniform intensity in a vertical direction (z-axis direction). The magnetic field H may be applied to the thermo-electromagnetic detector 310. Hereinafter, the substrate 210 and the thermo-electromagnetic detector 310 will be described.

The substrate 210 may be a base layer for forming the thermo-electromagnetic detector 310. The substrate 210 may include, for example, a silicon (Si) substrate. However, embodiments are not limited thereto, and the substrate 210 may include various materials.

A trench T may be provided in the substrate 210 by etching a portion of the substrate 210. Referring to FIGS. 2 and 3, an empty space ES may be formed in the trench T. As shown in FIG. 2, a portion of the magnetic field generator 100 may be exposed to the outside through the trench T. The depth h1 of the trench T may correspond to ¼ of the center wavelength of the infrared radiation incident on the support unit 21. For example, when the center wavelength of infrared radiation incident on the support unit 21 is 10 μm, the depth h1 of the trench T may be 2.5 μm. Therefore, the support unit 21 and the magnetic field generator 100 may be spaced apart from each other by the depth h1 of the trench T. In this case, optical resonance may occur between the support unit 21 and the magnetic field generator 100, thereby enhancing infrared absorption in the support unit 21.

The thermo-electromagnetic detector 310 may include a magnetic-electric converter 11 that is spaced apart from the substrate 210 and configured to generate an electrical signal according to a magnetic field H generated by the magnetic field generator 100, and an support unit 21 that is provided on the substrate 210 and supports the magnetic-electric converter 11 in a state in which the magnetic-electric converter 11 is spaced apart from the substrate 210 and is configured to absorb incident infrared radiation.

The magnetic-electric converter 11 may be spaced apart from the substrate 210. For example, the magnetic-electric converter 11 may be provided on the support unit 21.

The magnetic-electric converter 11 may include a conductive Hall plate 11*a*, a pair of bias electrodes 11*b* and 11*c* that are provided on both ends of the Hall plate 11*a* in a first direction (x-axis direction), and at least one pair of detection electrodes 11*d* and 11*e* that are provided on both ends of the Hall plate 11*a* in a second direction (y-axis direction) perpendicular to the first direction (x-axis direction). In this case, both the first direction (x-axis direction) and the second direction (y-axis direction) may be perpendicular to the direction (z-axis direction) of a magnetic field H generated by the magnetic field generator 100.

The Hall plate 11*a* may include a conductive material. For example, the Hall plate 11*a* may include an extrinsic semiconductor material doped with a dopant. For example, the Hall plate 11*a* may include an extrinsic semiconductor material obtained by doping a semiconductor material such as silicon (Si), gallium arsenide (GaAs), or germanium (Ge) with a given amount of a dopant such as phosphorus (P) or boron (B). However, embodiments are not limited thereto, and the type of semiconductor material and the type of dopant included in the Hall plate 11*a* may be selected from various types of materials other than the above-described examples. In addition, the concentration or ionization energy of the dopant in the Hall plate 11*a* may be adjusted such that Hall voltage $V_H$ (described later with reference to FIG. 5) which may be generated in the Hall plate 11*a* may vary with temperature in a room-temperature environment. The trend of Hall voltage $V_H$ varying with temperature in a room-temperature environment will be described with reference to FIGS. 7 to 17 with relation to the concentration or ionization energy of the dopant.

The Hall plate 11*a* may have a rectangular upper surface. For example, the Hall plate 11*a* may have a rectangular parallelepiped shape. However, embodiments are not limited thereto, and the Hall plate 11*a* may have various shapes. In addition, the length of the Hall plate 11*a* in the first direction (x-axis direction) may be greater than three times the length of the Hall plate 11*a* in the second direction (y-axis direction). However, embodiments are not limited thereto, and the ratio of the length of the Hall plate 11*a* in the first direction (x-axis direction) to the length of the Hall plate 11*a* in the second direction (y-axis direction) may vary.

When the Hall plate 11*a* has a rectangular parallelepiped shape, the pair of bias electrodes 11*b* and 11*c* may cover two opposite edges of the Hall plate 11*a* in the first direction (x-axis direction). The pair of bias electrodes 11*b* and 11*c* may be provided along a straight line parallel to the first direction (x-axis direction). For example, the pair of bias electrodes 11*b* and 11*c* may extend in the second direction (y-axis direction) and may cover two opposite edges of the Hall plate 11*a* in the first direction (x-axis direction). In addition, the pair of bias electrodes 11*b* and 11*c* may have a stepped shape such that the pair of bias electrodes 11*b* and 11*c* may be in contact with portions of an upper surface of a support plate 21*a* (described later) while covering the opposite edges of the Hall plate 11*a* in the first direction (x-axis direction). In addition, each of the pair of bias electrodes 11*b* and 11*c* may include a pattern extending from the Hall plate 11*a*. For example, each of the pair of bias electrodes 11*b* and 11*c* may include a rod pattern which is parallel to the first direction (x-axis direction) and extends in one direction away from the Hall plate 11*a*.

In this case, the pair of detection electrodes 11*d* and 11*e* may respectively be in contact with portions of the two opposite edges of the Hall plate 11*a* in the second direction (y-axis direction). The pair of detection electrodes 11*d* and 11*e* may be provided along a straight line parallel to the second direction (y-axis direction). In addition, each of the pair of detection electrodes 11*d* and 11*e* may extend in a direction away from the Hall plate 11*a* while being in contact with the Hall plate 11*a*. For example, each of the pair of detection electrodes 11*d* and 11*e* may include a bar pattern which is parallel to the second direction (y-axis direction) and extends in one direction away from the Hall plate 11*a*. The pair of detection electrodes 11*d* and 11*e* may have a stepped shape such that the pair of detection electrodes 11*d* and 11*e* may be in contact with portions of the upper surface of the support plate 21*a* (described later) while being respectively in contact with the two opposite edges of the Hall plate 11*a* in the second direction (y-axis direction).

A certain amount of current or voltage may be applied between the pair of bias electrodes 11*b* and 11*c*. Therefore, current may flow through the Hall plate 11*a* in the first direction (x-axis direction). When a magnetic field H is applied to the Hall plate 11*a* in the vertical direction (z-axis direction) by the magnetic field generator 100, the distribution of charge, density in the second direction (y-axis direction) across the Hall plate 11*a* becomes asymmetric. This phenomenon is called Hall effect. The Hall effect will be described later with reference to FIG. 5.

The support unit 21 may include the support plate 21*a* that is provided above the trench T to support the Hall plate 11*a*, an edge element 21*f* that is spaced apart from the support plate 21*a* and surrounds the support plate 21, and one or more connection units 21*b*, 21*c*, 21*d*, and 21*e* that connect the support plate 21*a* and the edge element 21*f* to each other.

The support plate 21*a* may have a rectangular parallelepiped shape. For example, the support plate 21*a* may have a thin plate shape. The support plate 21*a* may be at the center of a region in which the trench T is formed. In addition, the support plate 21*a* may support not only the Hall plate 11*a*, but also portions of the pair of bias electrodes 11*b* and 11*c* and portions of the pair of detection electrodes 11*d* and 11*e*.

The edge element 21*f* may cover an upper surface of the substrate 210. In this case, the edge element 21*f* may cover an upper edge surface of the substrate 210 which remains after the trench T is formed. As described above, because the support plate 21a is at the center of the region in which the trench T is formed and the edge element 21f covers the upper edge surface of the substrate 210, the edge element 21f may surround the support plate 21a. In addition, the support plate 21a and the edge element 21f may be provided in the same plane. In this case, as shown in FIG. 4, a gap G may be formed between the support plate 25a and the edge element 21f. The one or more connection units 21b, 21c, 21d, and 21e may be provided between the support plate 21a and the edge element 21f which are spaced apart from each other with the gap G therebetween. A first width w1 of the one or more connection units 21b, 21c, 21d, and 21e such as first to fourth connection units 21b, 21c, 21d, and 21e may be less than a second width w2 of the support plate 21a. In addition, the area of the first to fourth connection units 21b, 21c, 21d, and 21e may be less than the area of the support plate 21a. Based on the structure of the support unit 21, that is, a thermal isolation structure, thermal heat resulting from infrared absorption may be more efficiently transferred to the electro-magnetic converter 11, and as a result, infrared radiation may be efficiently converted into electrical energy.

For example, the support unit 21 may include the first connection unit 21b and the second connection unit 21c which connect both ends of the support plate 21a in the first direction (x-axis direction) to the edge element 21f. In addition, the support unit 21 may include the third connection unit 21d and the fourth connection unit 21e which connect both ends of the support plate 21a in the second direction (y-axis direction) to the edge element 21f. The first to fourth connection units 21b, 21c, 21d, and 21e may support the pair of bias electrodes 11b and 11c and the pair of detection electrodes 11d and 11e, respectively. For example, portions of the pair of bias electrodes 11b and 11c and the pair of detection electrodes 11d and 11e each extending in one direction from the Hall plate 11a may be respectively supported by the first connection unit 21b, the second connection unit 21c, the third connection unit 21d, and the fourth connection unit 21e.

The support plate 21a, the first to fourth connection units 21b, 21c, 21d, and 21e, and the edge element 21f may be provided in the same plane. In addition, the support plate 21a, the first to fourth connection units 21b, 21c, 21d, and 21e, and the edge element 21f may be formed in one piece.

The support unit 21 may include at least one selected from the group consisting of silicon oxide and silicon nitride. The silicon oxide may include, for example, $SiO_2$. The silicon nitride may include, for example, $Si_3N_4$. However, embodiments are not limited thereto, and the support unit 21 may include any material which has rigidity for supporting the magnetic-electric converter 11 and is capable of more efficiently absorbing infrared radiation in the long-wave infrared region.

As described above, because the magnetic-electric converter 11 is provided on the empty space ES formed in the trench T of the substrate 210 and is spaced apart from the substrate 210 due to the support unit 21, thermal energy may be more efficiently transferred to the magnetic-electric converter 11 than in the case in which the substrate 210 and the magnetic-electric converter 11 are in direct contact with each other.

Hereinafter, the Hall effect on the magnetic-electric converter 11 will be described with reference to FIG. 5. In FIG. 5, for ease of description, the pair of bias electrodes 11b and 11c and the pair of detection electrodes 11d and 11e are not shown.

Referring to FIG. 5, the Hall plate 11a having a thickness t may be configured such that a constant current may flow through the Hall plate 11a in the first direction (x-axis direction). For example, voltage $V_X$ having a certain magnitude may be applied to the Hall plate 11a in the first direction (x-axis direction), and then a negative (−) charge may move in the Hall plate 11a in the first direction (x-axis direction). In this case, when a magnetic field Hz is applied to the Hall plate 11a in the vertical direction (z-axis direction), the charge may be moved due to the Lorentz force in a direction, for example, the second direction (y-axis direction), which is perpendicular to both the first direction (x-axis direction) and the vertical direction (z-axis direction). In this case, the magnetic field Hz may be applied to the Hall plate 11a in the vertical direction (z-axis direction) by the magnetic field generator 100. Therefore, the distribution of charge density in the second direction (y-axis direction) across the Hall plate 11a becomes asymmetric, and thus a potential difference may be present in the second direction (y-axis direction) of the Hall plate 11a. In this case, the potential difference in the second direction (y-axis direction) of the Hall plate 11a is referred to as Hall voltage $V_H$. The Hall voltage $V_H$ generated in the second direction (y-axis direction) of the Hall plate 11a may be measured using the pair of detection electrodes 11d and 11e which are provided on opposite ends of the Hall plate 11a in the second direction (y-axis direction). For example, the Hall voltage $V_H$ generated in the second direction (y-axis direction) of the Hall plate 11a may be measured using a voltage measuring device which is connected to the pair of detection electrodes 11d and 11e. In this case, the Hall voltage $V_H$ may be determined by the ratio L/W of a first length L of the Hall plate 11a in the first direction (x-axis direction) to a second length W of the Hall plate 11a in the second direction (y-axis direction). For example, the ratio L/W may be greater than about 3. However, embodiments are not limited thereto, and the ratio L/W may be less than about 3.

Figure 6:
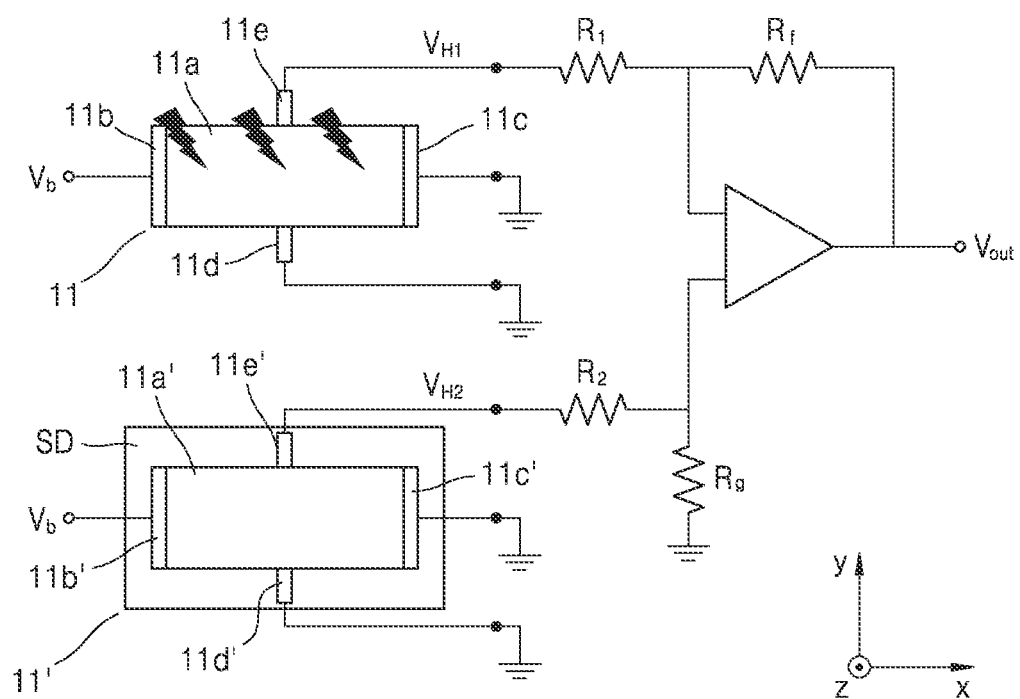
FIG. 6 is a view schematically illustrating a configuration of a reference converter which may be included in the long-wave infrared detecting element shown in FIG. 2 to remove an offset.

FIG. 6 is a view schematically illustrating a configuration of a reference converter 11' which may be included in the long-wave infrared detecting element 1100 shown in FIG. 2 to remove an offset.

As described with reference to FIGS. 2 and 5, the magnetic-electric converter 11 may include a Hall sensor. Ideally, the Hall voltage of the Hall sensor should be zero in a state in which no external magnetic field is applied, but in practice an offset may occur because of various factors such as process issues, for example, non-uniform electrical characteristics in the Hall sensor, or an asymmetrical electrode structure provided on the Hall sensor. The long-wave infrared detecting element 1100 shown in FIG. 2 may further include the reference converter 11' which is connected to the magnetic-electric converter 11 for reducing such an offset.

The reference converter 11' may include basically the same components as the magnetic-electric converter 11. For example, the reference converter 11' may include a conductive reference plate 11a', a pair of bias electrodes 11b' and 11c' that are provided at both ends of the reference plate 11a' in the first direction (x-axis direction), and at least one pair of detection electrodes 11d' and 11e' that are provided at both ends of the reference plate 11a' in the second direction (y-axis direction) perpendicular to the first direction (x-axis direction). In addition, the reference converter 11' may further include a shield layer SD that covers the reference plate 11a. Both the first direction (x-axis direction) and the second direction (y-axis direction) may be perpendicular to the direction (z-axis direction) of a magnetic field H (refer to FIG. 2) generated by the magnetic field generator 100

(refer to FIG. 2). The magnetic-electric converter 11 and the reference converter 11' may be connected to inputs in a differential amplifier circuit. The reference converter 11' may be manufactured together with the magnetic-electric converter 11 in the same process and may thus have the same offset. However, the reference converter 11' may include an infrared shield layer SD capable of blocking infrared radiation, and the incident infrared radiation does not cause a change in the output signal of the reference converter 11'. The infrared shield layer SD may cover not only the reference plate 11a' but also the pair of bias electrodes 11b' and 11c' and the pair of detection electrodes 11d' and 11e'. If the difference between a first Hall voltage $V_{H1}$ of the magnetic-electric converter 11 and a second Hall voltage $V_{H2}$ of the reference converter 11' is detected by a differential amplification, offsets due to various factors such as process issues may be compensated. For example, a differential amplification voltage Vout may be calculated as shown in Equation 1 below.

$$V_{out} = V_{H2} \frac{(R_f + R_1)R_g}{(R_g + R_2)R_1} - V_{H1} \frac{R_f}{R_1} \quad \text{Equation 1}$$

In Equation 1, $R_1$ and $R_f$ refer to resistances of resistors connected to the magnetic-electric converter 11, and $R_2$ and $R_g$ refer to resistances of resistors connected to the reference converter 11'.

Figure 7:
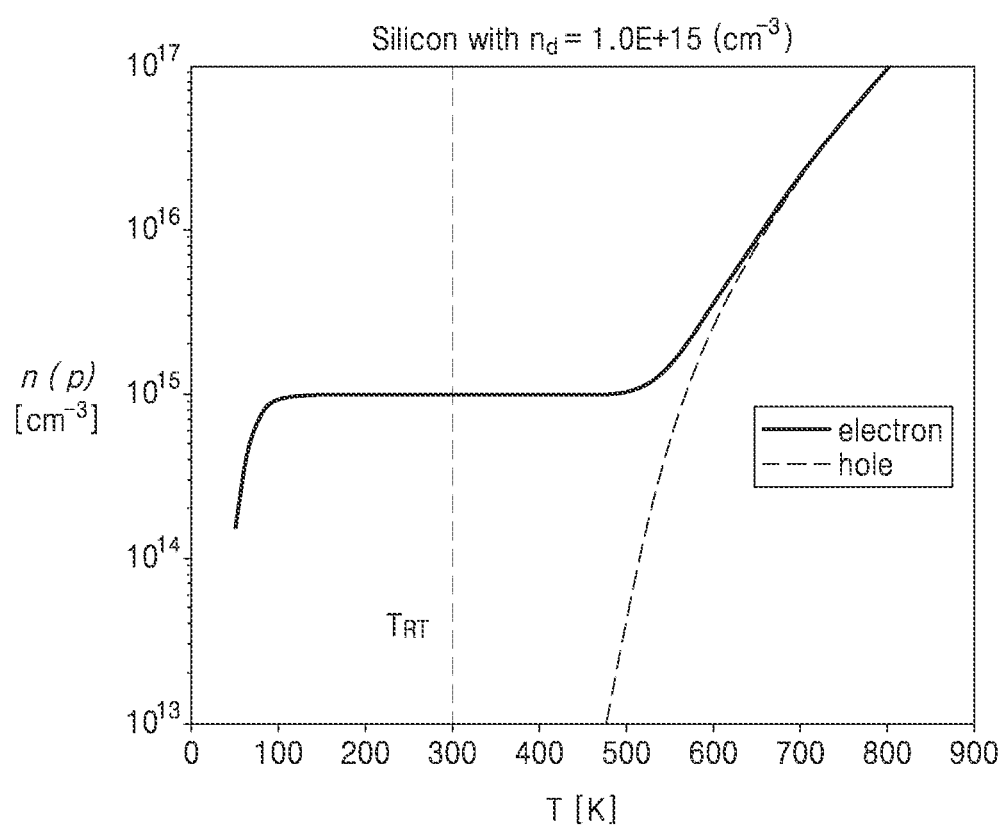
FIG. 7 is a graph illustrating the electron concentration and the hole concentration in a Hall plate shown in FIG. 2 with respect to temperature.
Figure 8:
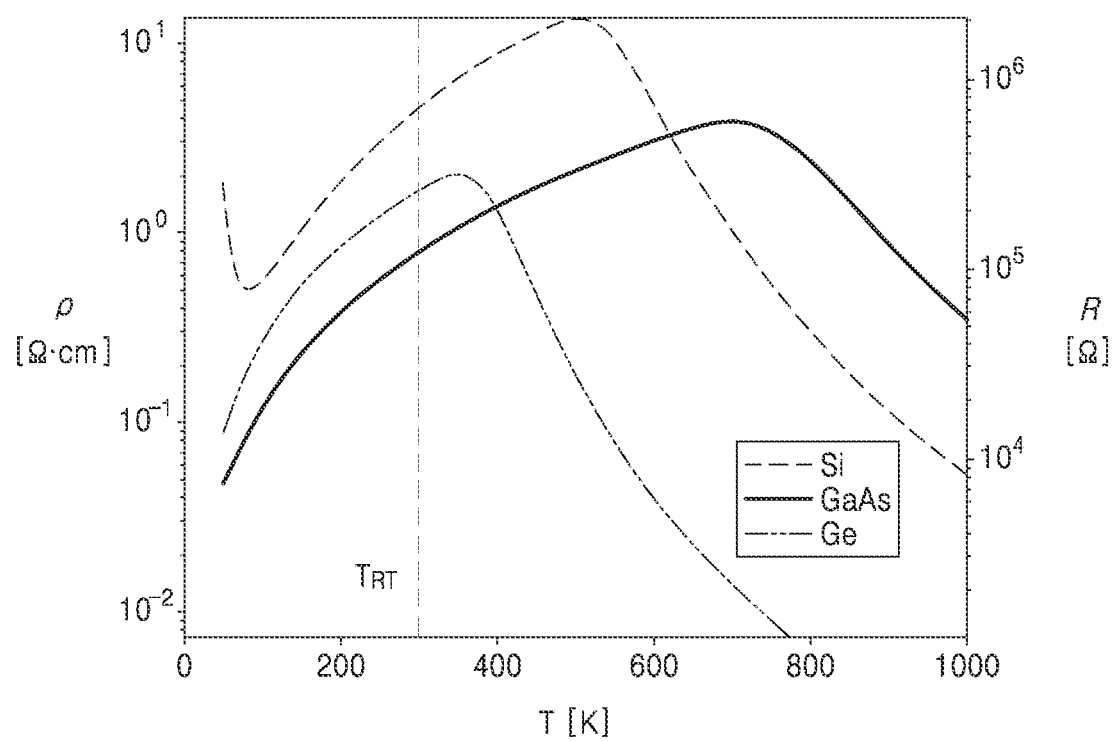
FIG. 8 is a graph illustrating changes in the resistivity and resistance of the Hall plate of FIG. 2 with respect to temperature.

FIG. 7 is a graph illustrating the concentration (n) of electrons and the concentration (p) of holes in the Hall plate 11a of FIG. 2 with respect to temperature T. FIG. 8 is a graph illustrating changes in the resistivity and resistance of the Hall plate 11a of FIG. 2 with respect to temperature T. FIG. 8 shows results when the thickness of the Hall plate 11a T (refer to FIG. 5) is 3.5 μm, and the ratio W/L (refer to FIG. 5) is 0.54.

FIG. 7 shows results when the Hall plate 11a of FIG. 2 is formed by doping a silicon (Si) material with an N-type dopant (or donor) at a concentration of about $10^{15}$ cm$^{-3}$ FIG. 8 shows results when the Hall plate 11a of FIG. 2 is formed by doping a semiconductor material such as silicon (Si), gallium arsenide (GaAs), or germanium (Ge) with an N-type dopant at a concentration of about $10^{15}$ cm$^{-3}$.

Referring to FIG. 7, the temperature-dependent behavior of the extrinsic semiconductors may be understood by dividing three temperature regions. In a temperature range (e.g., from about 100 K to about 450 K) including room temperature $T_{RT}$, the N-type dopant in the Hall plate 11a supplies electrons to the conduction band of the Hall plate 11a and is positively ionized but the concentration ($n_i$) of an intrinsic carriers is very low, and thus the concentration (n) of electrons in the conduction band is substantially equal to the concentration $N_d$ of the N-type dopant. The temperature range having the above-described characteristics is called an extrinsic region. In a temperature range which is lower than the extrinsic region, the N-type dopant implanted into the Hall plate 11a receives thermal energy and supplies electrons to the conduction band, but the concentration (n) of electrons supplied to the conduction band is less than the concentration $N_d$ of the N-type dopant, and the concentration (n) of electrons in the conduction band increases as temperature T increases. The temperature range having the above-described characteristics is called a freeze-out region. In a temperature range which is higher than the extrinsic region, the concentration ($n_i$) of the intrinsic carriers is greater than the concentration $N_d$ of the N-type dopant, and thus the concentration (n) of electrons is affected by the concentration ($n_i$) of the intrinsic carriers. The temperature range having these characteristics is called an intrinsic region.

Referring to FIG. 8, when the Hall plate 11a includes a silicon (Si) material, the resistivity and resistance of the Hall plate 11a increases as temperature T increases in the extrinsic region (e.g., from about 100 K to about 450 K as shown in FIG. 7). That is, the range in which the resistivity and resistance of the Hall plate 11a increases with temperature T corresponds to the extrinsic region described with reference to FIG. 7.

The temperature range, that is, the extrinsic region, in which the resistivity and resistance of the Hall plate 11a increases with temperature T, may vary depending on the material of the Hall plate 11a. For example, when the Hall plate 11a includes a gallium arsenide (GaAs) material, a temperature range from about 50 K to about 730 K may correspond to the extrinsic region. In addition, when the Hall plate 11a includes a germanium (Ge) material, a temperature range from about 50 K to about 350 K may correspond to the extrinsic region.

As described above with reference to FIGS. 7 and 8, the range, in which the temperature-dependent behavior of the major carrier concentration or the resistivity of the Hall plate 11a including doped semiconductors such as, for example, Si, GaAs, or Ge may be divided into three regions.

Figure 9:
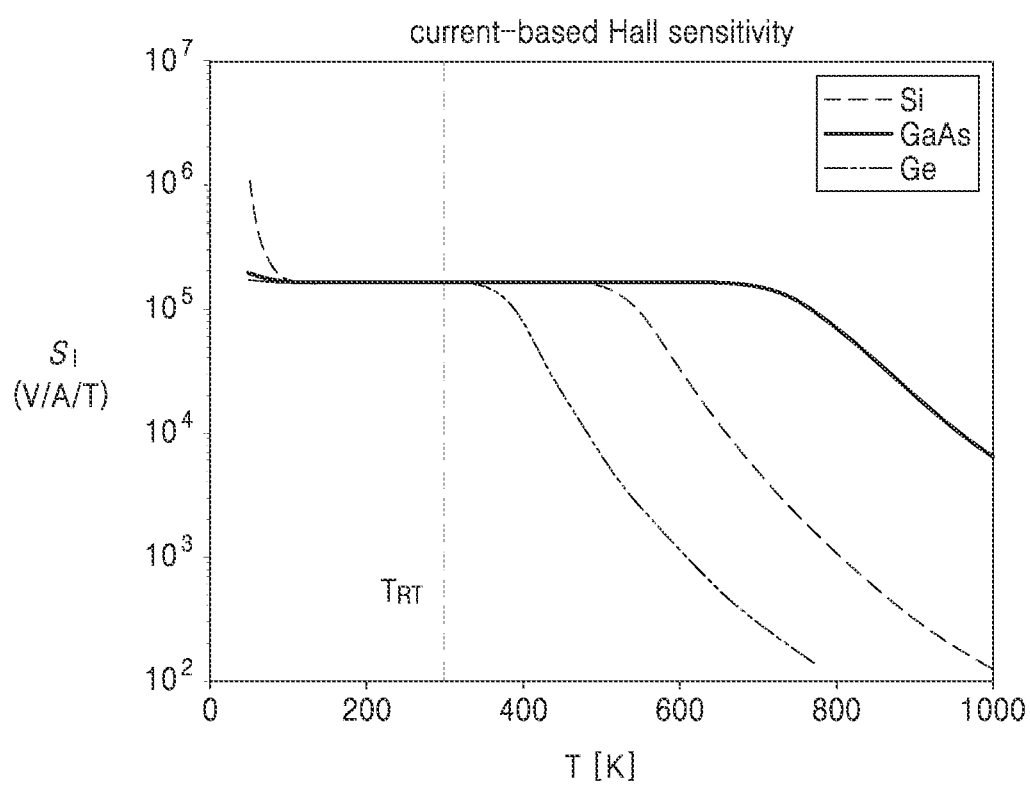
FIG. 9 is a graph illustrating changes in the current-based Hall sensitivity of the Hall plate of FIG. 2 with respect to temperature in a current bias mode.
Figure 10:
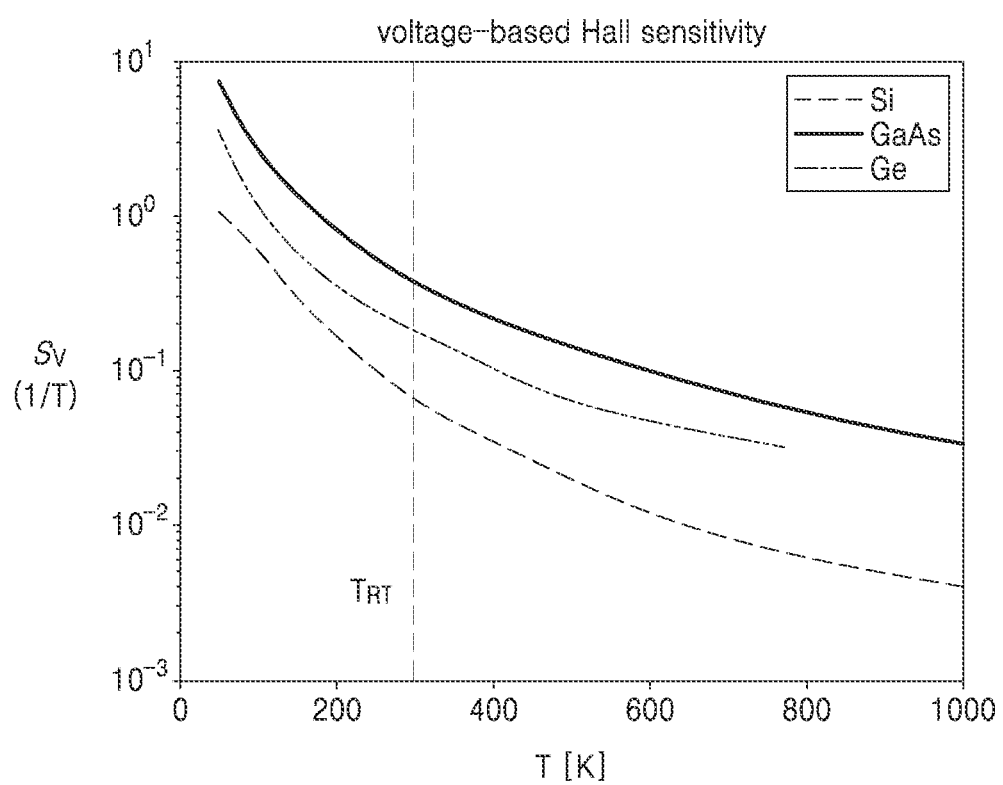
FIG. 10 is a graph illustrating changes in the voltage-based Hall sensitivity of the Hall plate of FIG. 2 with respect to temperature in a voltage bias mode.

FIG. 9 is a graph illustrating changes in the current-based Hall sensitivity $S_I$ of the Hall plate 11a of FIG. 2 with respect to temperature T in a current bias mode. FIG. 10 is a graph illustrating changes in the voltage-based Hall sensitivity $S_V$ of the Hall plate 11a of FIG. 2 with respect to temperature T in a voltage bias mode.

FIGS. 9 and 10 show results when the Hall plate 11a of FIG. 2 formed by doping a semiconductor material such as a silicon (Si), gallium arsenide (GaAs), or germanium (Ge) material with a dopant at a concentration of about $10^{15}$ cm$^{-3}$.

The current bias mode refers to a mode in which a constant current is applied between the pair of bias electrodes 11b and 11c provided on the Hall plate 11a. The current-based Hall sensitivity $S_I$ refers to a Hall voltage $V_H$ generated per unit magnetic field strength and unit bias current in the current bias mode, and is defined as in Equation 2 below.

$$S_I = \frac{V_H}{Hz * I_x} = \frac{r_H}{t} G \quad \text{Equation 2}$$

In Equation 2 above, $V_H$ refers to the Hall voltage of the Hall plate 11a in the current bias mode, $H_z$ refers to the strength of a magnetic field in the vertical direction (z-axis direction in FIG. 5), and $I_x$ refers to the amount of current flowing in the Hall plate 11a in the first direction (x-axis direction) in the current bias mode. In addition, $r_H$ refers to a Hall coefficient of the Hall plate 11a which is a function of the concentration of a dopant implanted into the Hall plate 11a and the temperature T of the Hall plate 11a. In addition, G refers to a shape coefficient of the Hall plate 11a.

The voltage bias mode refers to a mode in which a constant voltage is applied between the pair of bias electrodes 11b and 11c provided on the Hall plate 11a. The voltage-based Hall sensitivity $S_V$ refers to a Hall voltage $V_H$ generated per unit magnetic field strength and unit bias voltage in the voltage bias mode, and is defined as in Equation 3 below.

$$S_V = \frac{V_H}{Hz * V_x} = \frac{r_H}{\rho} \frac{W}{L} G \qquad \text{Equation 3}$$

In Equation 3 above, $V_H$ refers to the Hall voltage of the Hall plate 11a in the voltage bias mode, $H_Z$ refers to a magnetic field in the vertical direction (z-axis direction in FIG. 5), and $V_x$ refers to a constant potential difference between the pair of bias electrodes 11b and 11c in the voltage bias mode. In addition, $r_H$ refers to a Hall coefficient of the Hall plate 11a which is a function of the concentration of a dopant implanted into the Hall plate 11a and the temperature T of the Hall plate 11a. In addition, p refers to the resistivity of the Hall plate 11a, and L and W respectively refer to the lengths of the Hall plate 11a in the first and second directions (x-axis and y-axis directions) (refer to FIG. 5). In addition, G refers to a shape coefficient of the Hall plate 11a.

Referring to FIG. 9, in the current bias mode, the Hall plate 11a includes a range in which the current-based Hall sensitivity $S_I$ is constant with respect to temperature T. The range in which the current-based sensitivity $S_I$ is constant with respect to temperature T corresponds to the extrinsic region described with reference to FIG. 7. Furthermore, a temperature range, which is lower than the extrinsic region and in which the current-based hall sensitivity $S_I$ of the Hall plate 11a decreases with temperature T, corresponds to the freeze-out region described with reference to FIG. 7, and a temperature range, which is higher than the extrinsic region and in which the current-based hall sensitivity $S_I$ of the Hall plate 11a decreases with temperature T, corresponds to the intrinsic region described with reference to FIG. 7. As described above, in the current bias mode, the trend of changes in the current-based Hall sensitivity $S_I$ of the Hall plate 11a may change depending on the temperature ranges. Referring to FIG. 10, in the voltage bias mode, the voltage-based Hall sensitivity $S_V$ of the Hall plate 11a decreases as temperature T increases throughout the entire temperature range.

Figure 11:
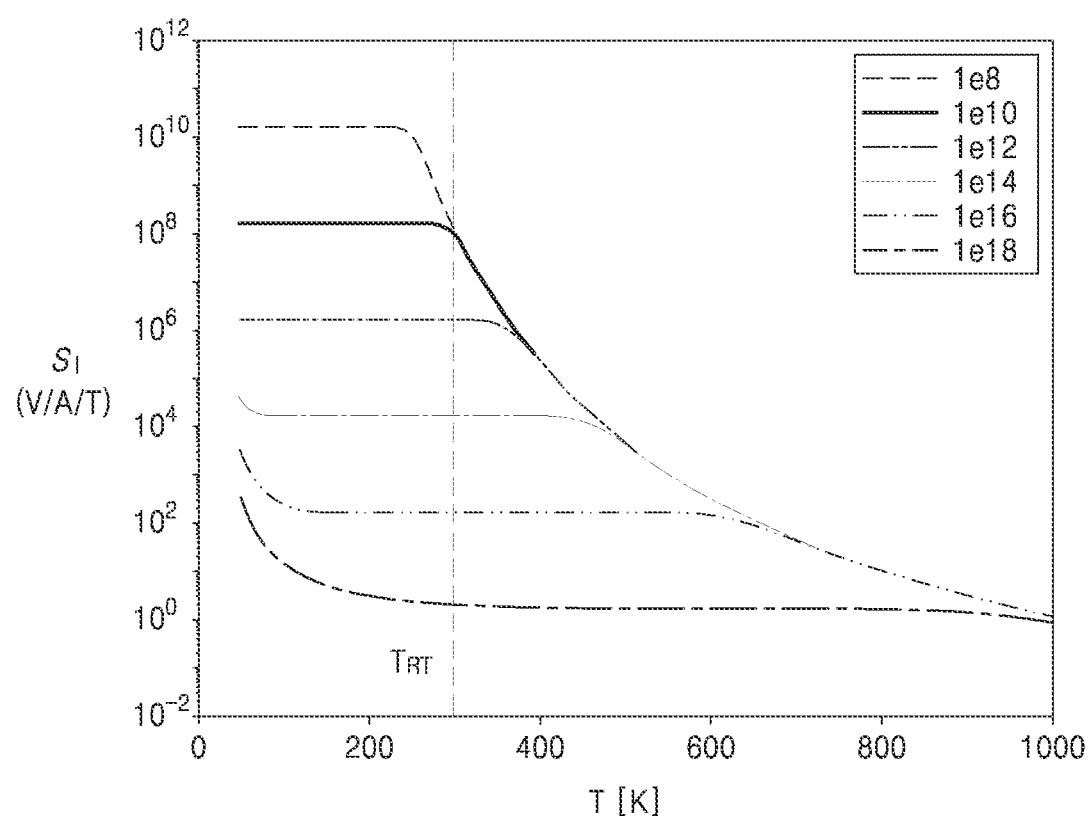
FIG. 11 is a graph illustrating a change of the current-based Hall sensitivity of the Hall plate of FIG. 2 which varies depending on the concentration of a dopant in the Hall plate.
Figure 12:
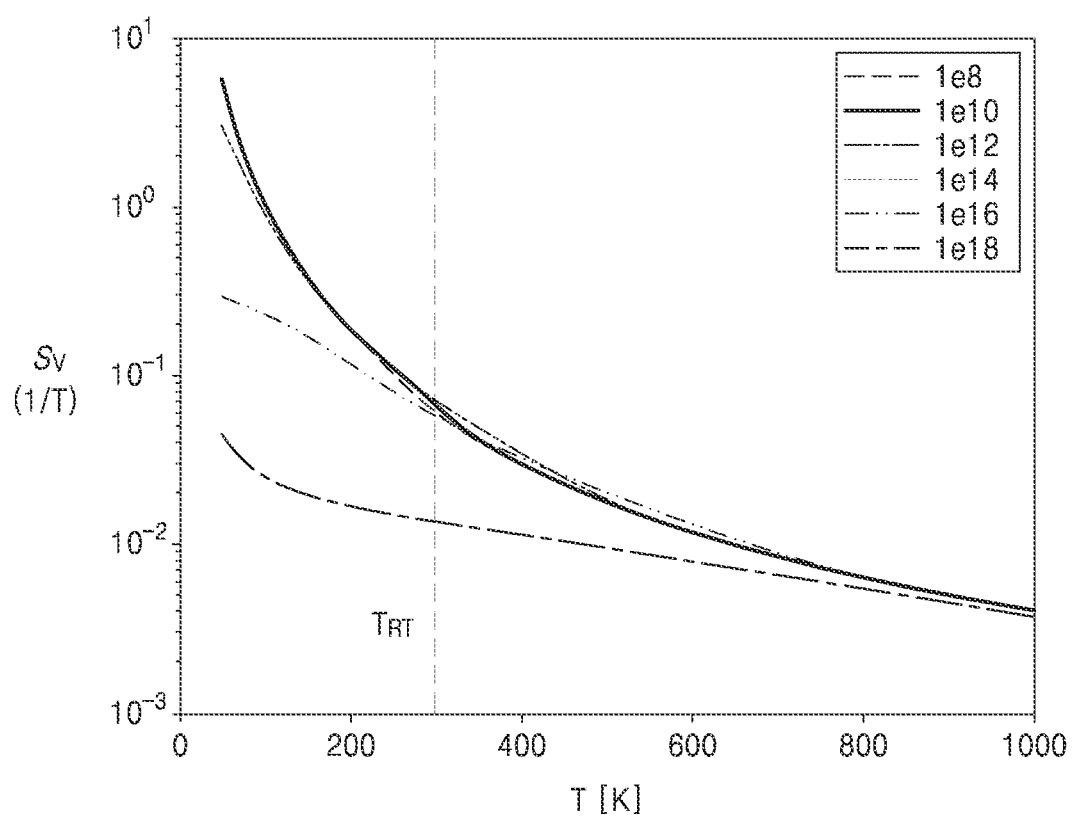
FIG. 12 is a graph illustrating a change of the voltage-based Hall sensitivity of the Hall plate of FIG. 2 which varies depending on the concentration of a dopant in the Hall plate.
Figure 13:
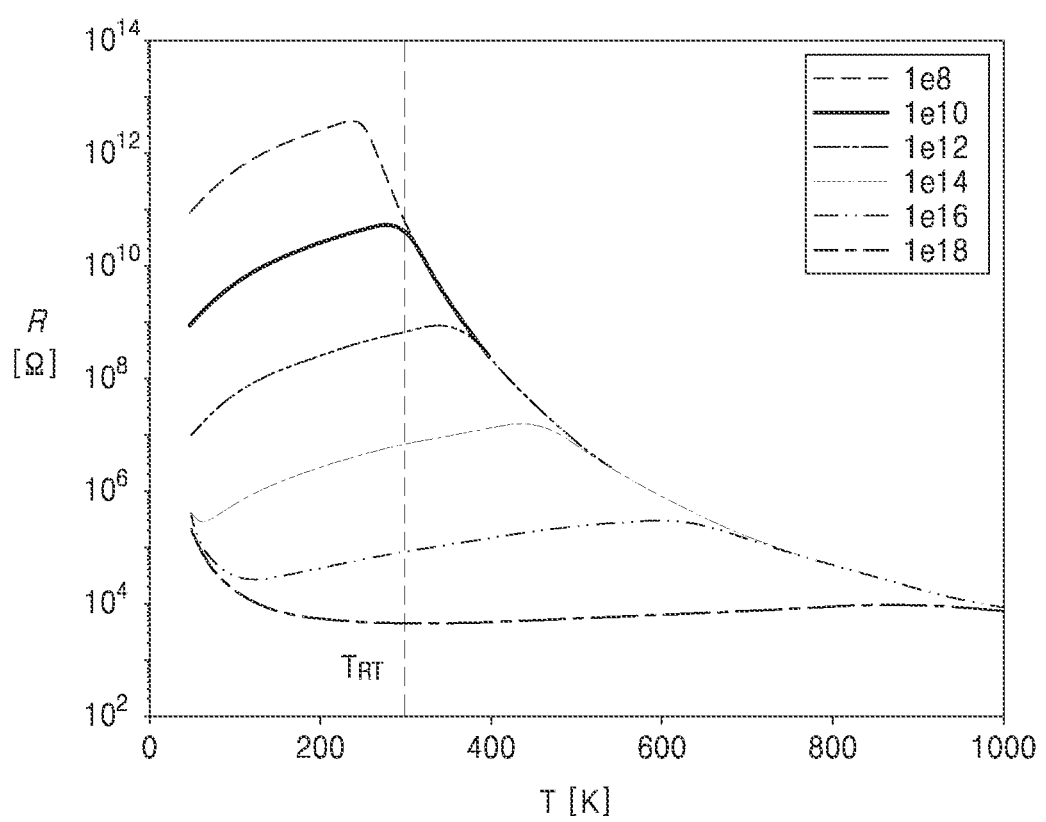
FIG. 13 is a graph illustrating a change of the resistance of the Hall plate of FIG. 2 which varies depending on the concentration of a dopant in the Hall plate.

FIG. 11 is a graph illustrating a change of the current-based Hall sensitivity $S_I$ of the Hall plate 11a of FIG. 2 which varies depending on the concentration of a dopant in the Hall plate 11a. FIG. 12 is a graph illustrating a change of the voltage-based Hall sensitivity $S_V$ of the Hall plate 11a of FIG. 2 which varies depending on the concentration of a dopant in the Hall plate 11a. FIG. 13 is a graph illustrating a change of the resistance R of the Hall plate 11a of FIG. 2 which varies depending on the concentration of a dopant in the Hall plate 11a. FIG. 14 is a table showing the resistance of the Hall plate 11a of FIG. 2 at room temperature $T_{RT}$ and the rate of change in the voltage-based Hall sensitivity $S_V$ of the Hall plate 11a with respect to temperature at room temperature $T_{RT}$ for different dopant concentrations.

FIGS. 11 to 14 show results when the Hall plate 11a is formed by doping a silicon (Si) material with phosphorus (P).

Referring to FIG. 11, the current-based Hall sensitivity $S_I$ of the Hall plate 11a may be adjusted to be constant in a temperature range including room temperature $T_{RT}$ by adjusting the concentration of a dopant in the Hall plate 11a. That is, the concentration of a dopant in the Hall plate 11a may be determined such that in the current bias mode, the Hall voltage $V_H$ of the Hall plate 11a may be constant regardless of the temperature T of the Hall plate 11a in a temperature range of about 250 K to about 380 K. For example, when the concentration of a dopant (e.g., phosphorus) in the Hall plate 11a is about $10^{12}$ cm$^{-3}$ to about $10^{16}$ cm$^{-3}$ as shown in FIG. 11, the current-based Hall sensitivity $S_I$ of the Hall plate 11a in the current bias mode may be constant regardless of the temperature T of the magnetic-electric 11 in a temperature range of about 250 K to about 380 K. However, when the concentration of a dopant (e.g., phosphorus) in the Hall plate 11a is less than about $10^{12}$ cm$^{-3}$, the Hall voltage $V_H$ of the Hall plate 11a may decrease as temperature increases in a temperature range of about 250K to 380K.

Referring to FIG. 12, the voltage-based Hall sensitivity $S_V$ of the Hall plate 11a may decrease as temperature T increases throughout the entire temperature range regardless of the concentration of a dopant in the Hall plate 11a. That is, in the voltage bias mode, the Hall voltage $V_H$ of the Hall plate 11a may decrease as the temperature T of the Hall plate 11a increases. However, as shown in FIG. 12, the Hall plate 11a may have different rates of change at a given temperature in voltage-based Hall sensitivity $S_V$ with respect to temperature depending on the concentration of a dopant in the Hall plate 11a. For example, as shown in FIGS. 12 and 14, when the concentration $N_d$ of a dopant (e.g., phosphorus) in the Hall plate 11a is about $10^{18}$ cm$^{-3}$, the rate of change in the voltage-based Hall sensitivity $S_V$ of the Hall plate 11a with respect to temperature T may be about −0.18%/K at room temperature $T_{RT}$. In addition, when the concentration $N_d$ of a dopant (e.g., phosphorus) implanted into the Hall plate 11a is about $10^{10}$ cm$^{-3}$, the rate of change in the voltage-based Hall sensitivity $S_V$ of the Hall plate 11a with respect to temperature T may be about −1.32%/K at room temperature $T_{RT}$. According to the concentration $N_d$ of a dopant in the Hall plate 11a, the rate of change in the voltage-based Hall sensitivity $S_V$ of the Hall plate 11a with respect to temperature T may be determined for measuring temperatures in the voltage bias mode. For example, the concentration of a dopant in the Hall plate 11a may be adjusted such that the rate of change in the voltage-based Hall sensitivity $S_V$ of the Hall plate 11a with respect to temperature T may be within the range of about −0.5%/K to about −1.0%/K at room temperature in the voltage bias mode. For example, when the concentration of a dopant (e.g., phosphorus) implanted into the Hall plate 11a is about $10^{12}$ cm$^{-3}$ to about $10^{16}$ cm$^{-3}$, the rate of change in the voltage-based Hall sensitivity $S_V$ of the Hall plate 11a with respect to temperature T may be within the range of about −0.5%/K to about −1.0%/K at room temperature in the voltage bias mode.

Referring to FIG. 13, as the concentration of a dopant (e.g., phosphorus) in the Hall plate 11a increases, the resistance R of the Hall plate 11a decreases. In addition, when the concentration of a dopant (e.g., phosphorus) in the Hall plate 11a is within a certain range, an extrinsic region may be present in which the resistance R of the Hall plate 11a increases with temperature T in a certain temperature range including room temperature $T_{RT}$. For example, when the concentration of a dopant (e.g., phosphorus) implanted into the Hall plate 11a is about $10^{12}$ cm$^{-3}$ to about $10^{16}$ cm$^{-3}$, the resistance R of the Hall plate 11a may increase with temperature T in a temperature range of about 250 K to about 380 K. In addition, when the concentration of a dopant (e.g., phosphorus) implanted into the Hall plate 11a is about $10^{12}$ cm$^{-3}$ to about $10^{16}$ cm$^{-3}$ as shown in FIG. 14, the resistance R of the Hall plate 11a may be within the range of about 800Ω to about 7000 kΩ at room temperature. When the concentration of a dopant (e.g., phosphorus) implanted into the Hall plate 11a is less than about $10^{12}$ cm$^{-3}$, the resistance R of the Hall plate 11a may be about $10^8$ Ω or more, and thus it may be difficult to detect a Hall voltage $V_H$.

As described above with reference to FIGS. 11 to 14, the concentration of a dopant in the Hall plate 11a may be determined such that in a given temperature range including room temperature $T_{RT}$, the Hall plate 11a may have a suitable resistance value R for detecting a Hall voltage $V_H$, a suitable rate of change in voltage-based Hall sensitivity $S_V$ for detecting temperatures in the voltage bias mode, and an extrinsic region in the current bias mode. Referring to FIGS. 11 to 14, for example, the concentration of a dopant (e.g., phosphorus) in the Hall plate 11a may be set to be about $10^{12}$ cm$^{-3}$ to about $10^{16}$ cm$^{-3}$.

Figure 15:
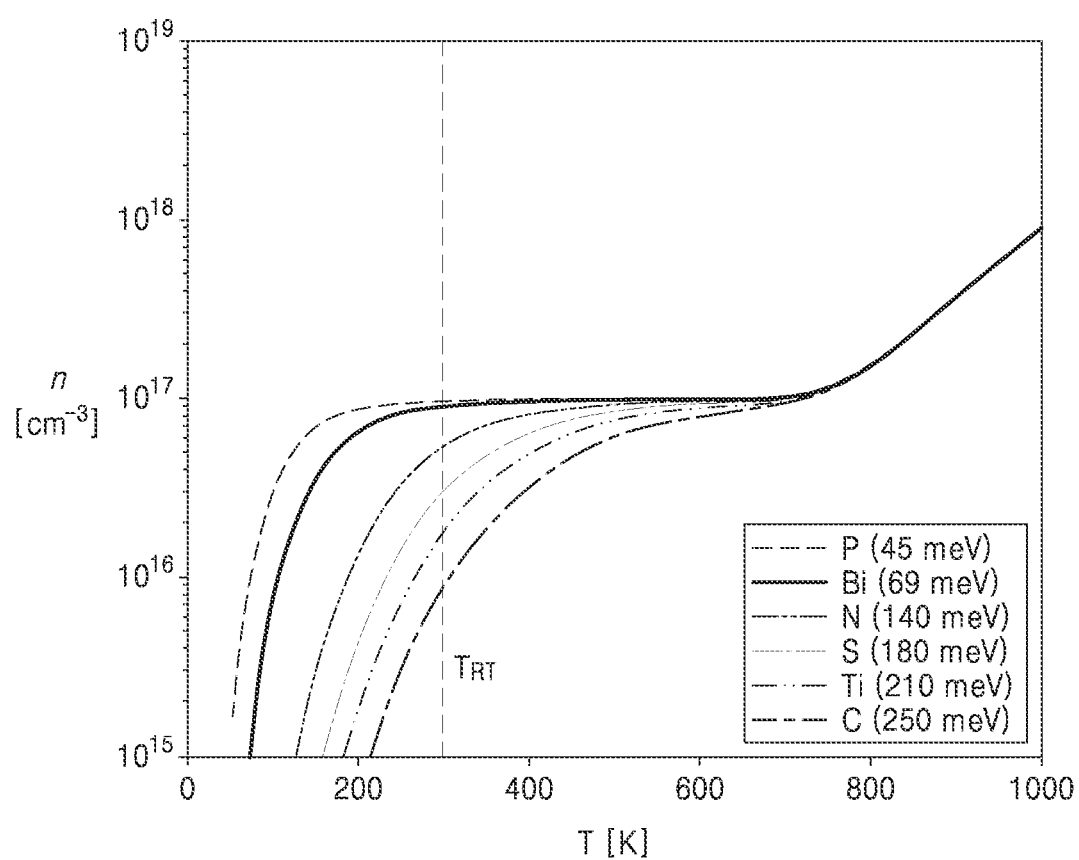
FIG. 15 is a graph illustrating a change of the electron concentration in the Hall plate of FIG. 2 according to the ionization energy of dopants.
Figure 16:
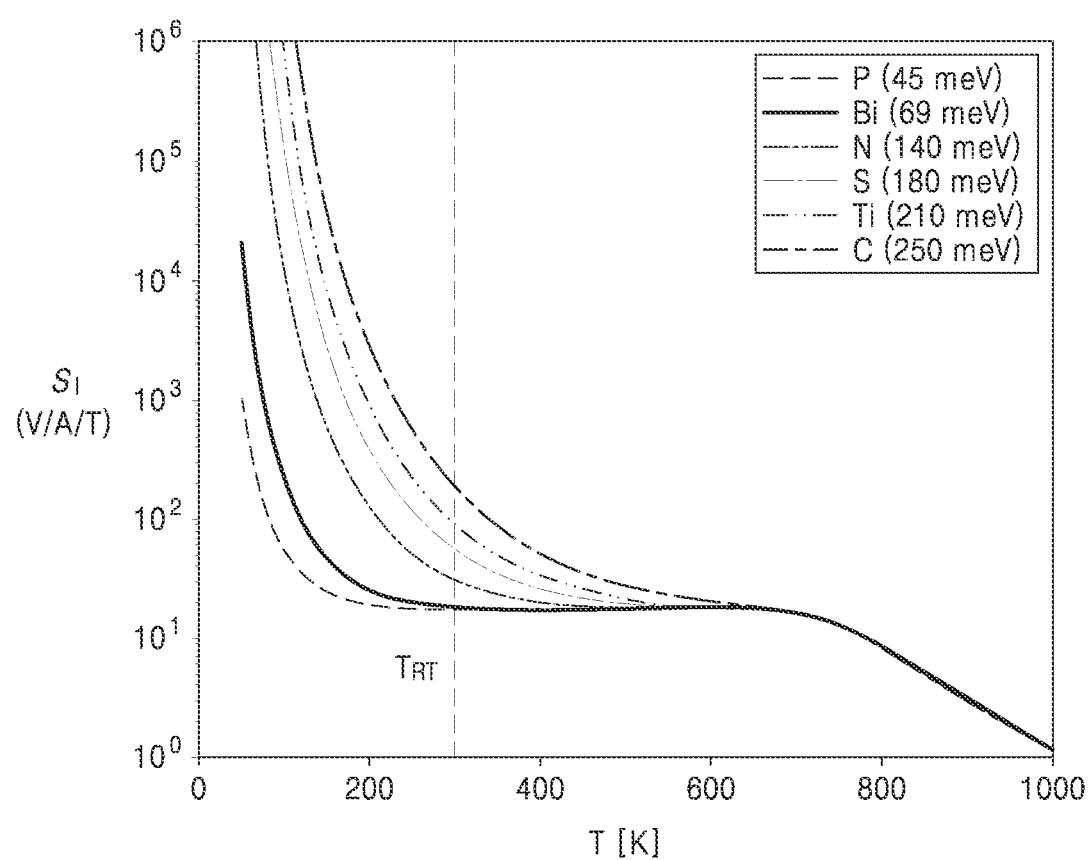
FIG. 16 is a graph illustrating a change of the current-based Hall sensitivity of the Hall plate of FIG. 2 with respect to the temperature of the Hall plate according to the ionization energy of dopants.

FIG. 15 is a graph illustrating a change of the electron concentration in the Hall plate 11a of FIG. 2 according to the ionization energy of dopants. FIG. 16 is a graph illustrating a change of the current-based Hall sensitivity $S_I$ of the Hall plate 11a of FIG. 2 with respect to the temperature T of the Hall plate 11a according to the ionization energy of dopants. FIG. 17 is a table showing the rate of change in the current-based Hall sensitivity $S_I$ of the Hall plate 11a of FIG. 2 at room temperature $T_{RT}$ according to the ionization energy of dopants.

FIGS. 15 to 17 show results when the Hall plate 11a is formed by doping a silicon (Si) material with dopants having various ionization energies at a concentration of about $10^{17}$ cm$^{-3}$. However, embodiments are not limited thereto, and dopants having various ionization energies may be implanted into the Hall plate 11a at a concentration of about $10^{12}$ cm$^{-3}$ to about $10^{17}$ cm$^{-3}$. Even when dopants having various ionization energies are implanted into the Hall plate 11a as described above, the voltage-based Hall sensitivity $S_V$ of the Hall plate 11a in the voltage bias mode may decrease as the temperature T of the Hall plate 11a increases throughout the entire temperature range of the Hall plate 11a.

As described above with reference to FIG. 9, the trend of changes in the current-based hall sensitivity $S_I$ of the Hall plate 11a may vary depending on temperature ranges. Therefore, when the freeze-out or the intrinsic region appears in a certain temperature range including room temperature $T_{RT}$, temperature-dependent changes in the current-based Hall voltage $V_H$ of the Hall plate 11a may be detected in the certain temperature range including room temperature $T_{RT}$.

Referring to FIG. 15, when the ionization energy of a dopant implanted into the Hall plate 11a is high, the dopant may not be sufficiently ionized, and a freeze-out region in which the concentration (n) of electrons increases as temperature T increases may be present in a temperature range including room temperature $T_{RT}$. For example, when carbon (C, 250 meV), titanium (Ti, 210 meV), sulfur (S, 180 meV), or nitrogen (N, 140 meV) having relatively high ionization energy is implanted into the Hall plate 11a (at a concentration of about $10^{17}$ cm$^{-3}$) as shown in FIG. 15, a freeze-out region may be present in a temperature range including room temperature $T_{RT}$.

Referring to FIG. 16, when the ionization energy of a dopant in the Hall plate 11a is high, a freeze-out region in which the current-based Hall sensitivity $S_I$ of the Hall plate 11a decreases as the temperature T of the Hall plate 11a increases may be present in the current bias mode in a temperature range including room temperature $T_{RT}$. For example, the current-based Hall voltage $V_H$ of the Hall plate 11a may decrease as the temperature T of the Hall plate 11a increases in a temperature range including room temperature $T_{RT}$ according to the ionization energy of the dopant. For example, the ionization energy of the dopant may be determined such that the current-based Hall voltage $V_H$ of the Hall plate 11a may decrease as the temperature T of the Hall plate 11a increases in a temperature range of about 250 K to about 400 K. For example, as shown in FIG. 16, when carbon (C, 250 meV), titanium (Ti, 210 meV), sulfur (S, 180 meV), or nitrogen (N, 140 meV) having relatively high ionization energy is implanted into the Hall plate 11a (at a concentration of about $10^{17}$ cm$^{-3}$), a freeze-out region in which the current-based Hall voltage $S_I$ of the Hall plate 11a decreases as the temperature T of the Hall plate 11a increases may be present in a temperature range including room temperature $T_{RT}$.

Referring to FIG. 17, a suitable rate of change in the current-based Hall sensitivity $S_V$ of the Hall plate 11a with respect to temperature T may be determined according to the ionization energy Ed of a dopant in the Hall plate 11a. For example, the ionization energy of a dopant may be determined such that the rate of change in the current-based Hall sensitivity $S_I$ of the Hall plate 11a with respect to temperature T may be within the range of about –1.0%/K to about –2.0%/K at room temperature $T_{RT}$. For example, when the ionization energy of a dopant implanted in the Hall plate 11a is about 170 meV to about 270 meV, the rate of change in the current-based Hall sensitivity $S_I$ of the Hall plate 11a with respect to temperature T may be within the range of about –1.0%/K to about –2.0%/K at room temperature $T_{RT}$.

As described above with reference to FIGS. 15 to 17, the ionization energy of a dopant in the Hall plate 11a may be adjusted such that a freeze-out region in which the current-based Hall voltage Si of the Hall plate 11a decreases as the temperature T of the Hall plate 11a increases may be present in a temperature range including Room temperature $T_{RT}$. In addition, the ionization energy of a dopant in the Hall plate 11a may be adjusted such that a suitable rate of change in the current-based Hall sensitivity $S_I$ of the Hall plate 11a with respect to temperature T may be obtained for temperature measurement. Referring to FIGS. 15 to 17, the ionization energy of a dopant in the Hall plate 11a may be set to be about 170 meV to about 270 meV. For example, a dopant such as carbon (C, 250 meV), titanium (Ti, 210 meV), or sulfur (S, 180 meV) may be implanted into the Hall plate 11a.

Figure 18:
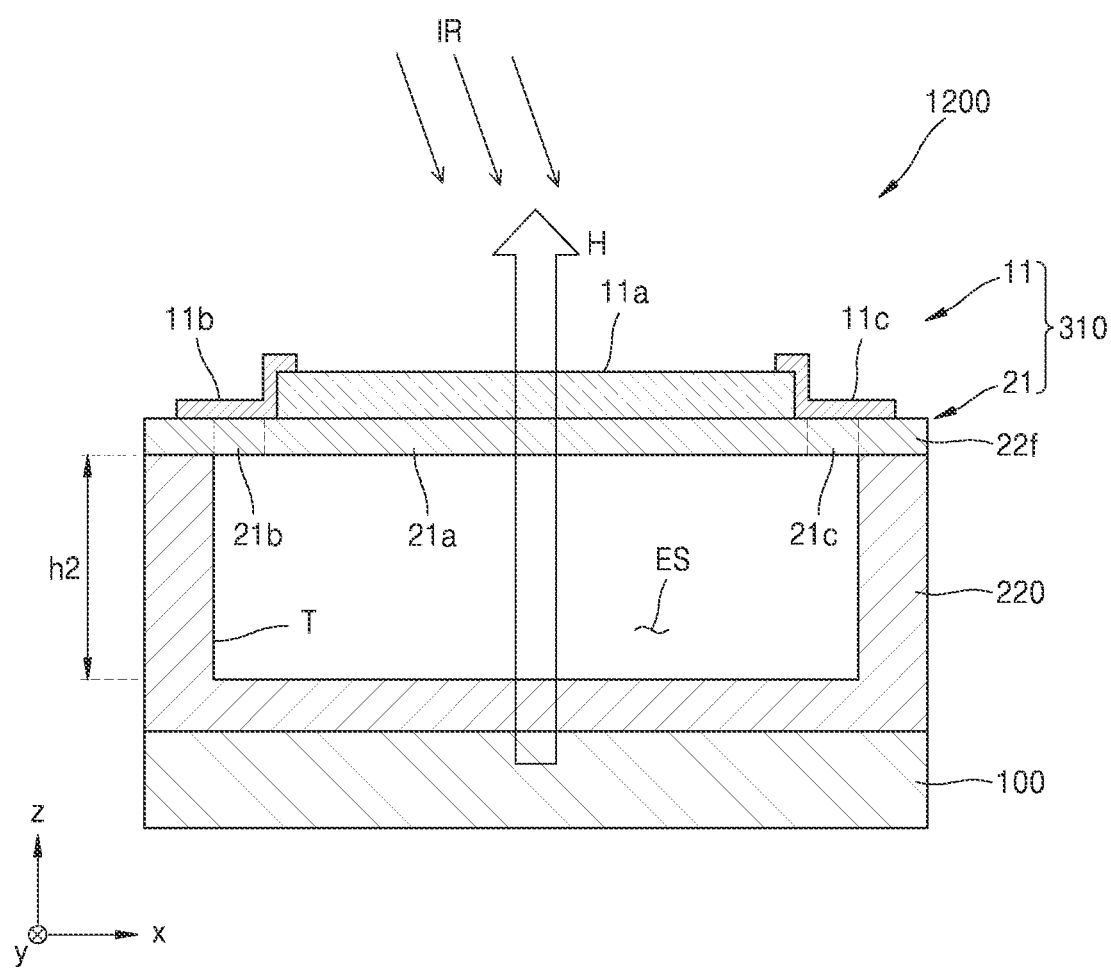
FIG. 18 is a view schematically illustrating an example configuration of a long-wave infrared detecting element according to another example embodiment.

FIG. 18 is a view schematically illustrating an example configuration of a long-wave infrared detecting element 1200 according to another example embodiment. The long-wave infrared detecting element 1200 shown in FIG. 18 may be substantially the same as the long-wave infrared detecting element 1100 shown in FIGS. 2 and 3 except that a magnetic field generator 100 is not exposed to the outside through a trench T. In the following description given with reference to FIG. 18, the same description as that given with reference to FIGS. 2 to 17 will be omitted.

Referring to FIG. 18, the trench T is formed by etching a portion of a substrate 220. An empty space ES may be formed inside the trench T. The trench T may not completely penetrate the substrate 220. Therefore, as shown in FIG. 18, the magnetic field generator 100 may be covered by the substrate 220, and thus may not be exposed to the outside. The depth h2 of the trench T may correspond to ¼ of the wavelength of infrared rays IR incident on an support unit 21. For example, when the wavelength of infrared rays incident on the support unit 21 is 10 μm, the depth h2 of the trench T may be about 2.5 μm. Therefore, the support unit 21 and the substrate 220 may be spaced apart from each other by the depth h2 of the trench T. In this case, optical resonance may occur between the support unit 21 and the substrate 220, and absorption of infrared rays IR in the support unit 21 may be enhanced.

Figure 19:
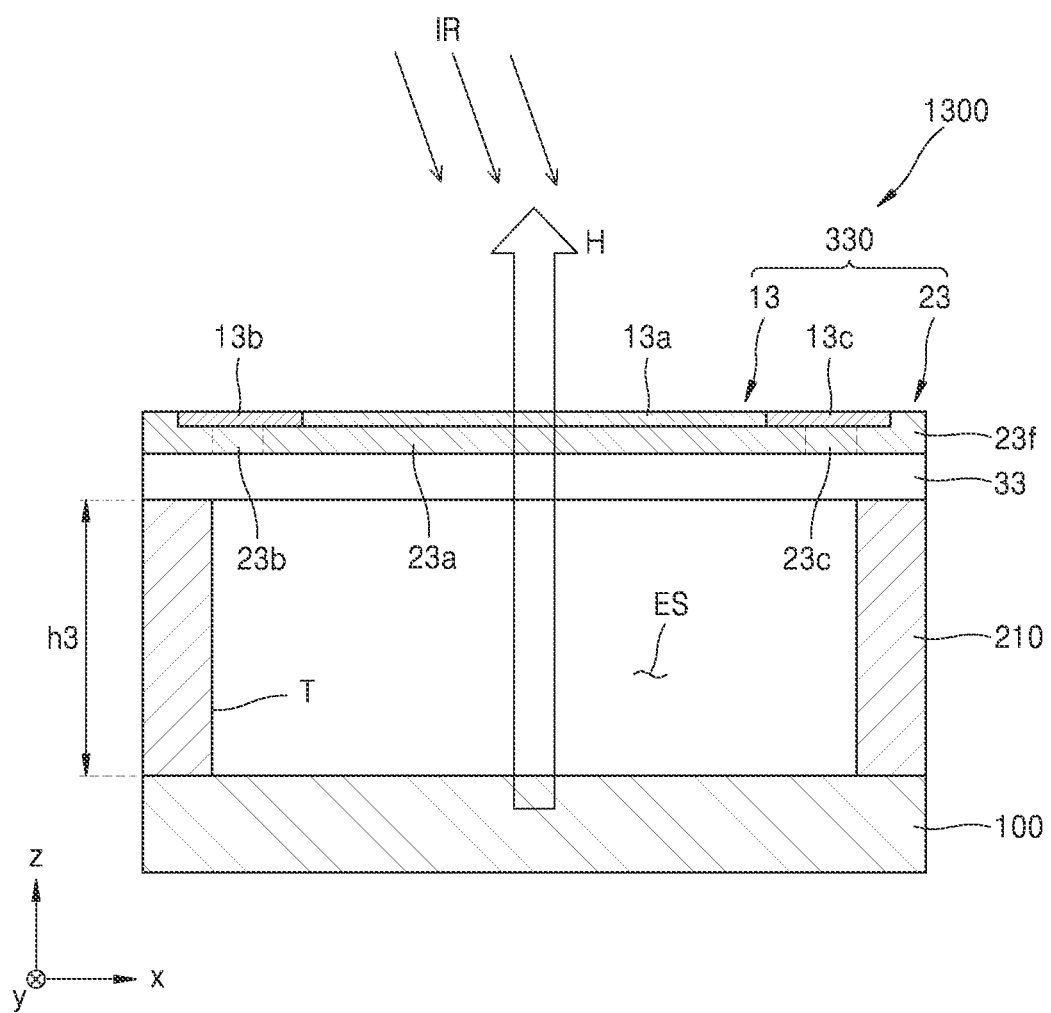
FIG. 19 is a view schematically illustrating an example configuration of a long-wave infrared detecting element according to another example embodiment.
Figure 20:
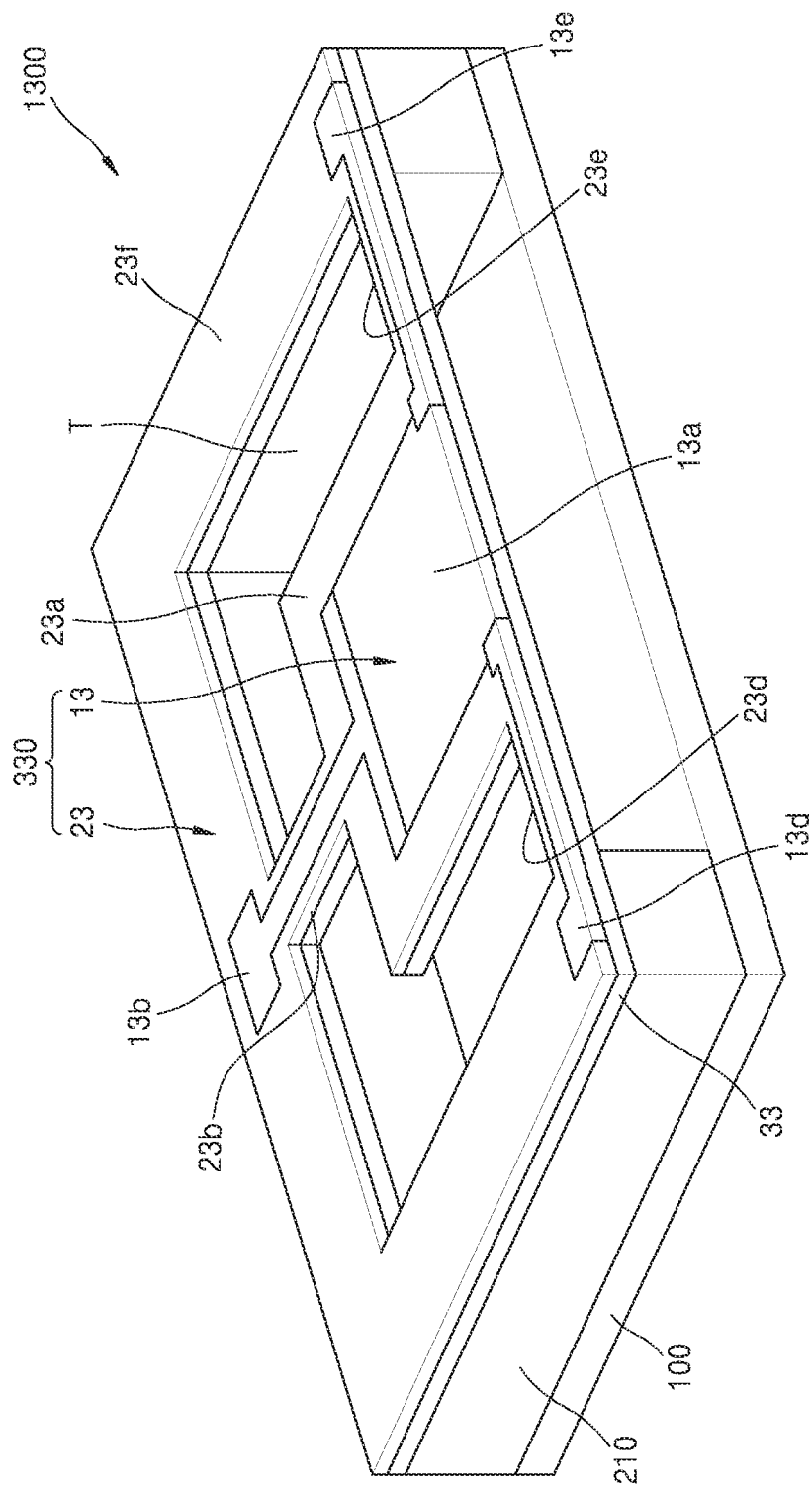
FIG. 20 is a view schematically illustrating an example configuration of the long-wave infrared detecting element shown in FIG. 19.

FIG. 19 is a view schematically illustrating an example configuration of a long-wave infrared detecting element 1300 according to another example embodiment. FIG. 20 is a view schematically illustrating an example configuration of the long-wave infrared detecting element 1300 shown in FIG. 19. The long-wave infrared detecting element 1300 shown in FIGS. 19 and 20 is substantially the same as the long-wave infrared detecting element 1100 shown in FIGS. 2 and 3 except that the long-wave infrared detecting element 1300 further includes an insulating layer 33, a magnetic-electric converter 13 is inserted in a region of an support unit 23, and the support unit 23 includes a material different from the material included in the support unit 21 shown in FIGS. 2 and 3. In the following description given with reference to FIGS. 19 and 20, the same description as that given with reference to FIGS. 2 to 17 will be omitted.

Referring to FIGS. 19 and 20, a Hall plate 13a of the magnetic-electric converter 13 may be inserted in a region of a support plate 23a. For example, the Hall plate 13a may be formed by implanting dopant into a region of an upper portion of the support plate 23a. In this case, the support plate 23a may include an intrinsic semiconductor material. For example, the support plate 23a may include a silicon (Si) material, but is not limited thereto. A region of the support plate 23a may be doped with a dopant such that the region of the support plate 23a may include an extrinsic semiconductor material. The region including the extrinsic semiconductor material may be referred to as the Hall plate 13a.

In addition, a pair of bias electrodes 13b and 13c and a pair of detection electrodes 13d and 13e may be inserted in regions of the support plate 23a, first to fourth connection portions 23b, 23c, 23d, and 23e, and an edge element 23f. For example, some regions of upper sides of the support plate 23a, the first to fourth connection portions 23b, 23c, 23d, and 23e, and the edge element 23f may be doped with a dopant to form the pair of bias electrodes 13b and 13c and the pair of detection electrodes 13d and 13e.

The long-wave infrared detecting element 1300 may further include the insulating layer 33 which is provided between a substrate 210 and a thermal-electromagnetic detector 330. The insulating layer 33 may insulate the substrate 210 and the support unit 23 including an intrinsic semiconductor material from each other. In addition, the insulating layer 33 may absorb infrared rays (IR) incident from the outside like the support unit 21 described with reference to FIGS. 2 and 3. For example, the insulating layer 33 may include at least one selected from the group consisting of silicon oxide and silicon nitride. The silicon oxide may include, for example, $SiO_2$. The silicon nitride may include, for example, $Si_3N_4$. However, embodiments are not limited thereto, and the insulating layer 33 may include various materials which are electrically insulative and capable of efficiently absorbing infrared radiation in the long-wave infrared region.

Figure 21:
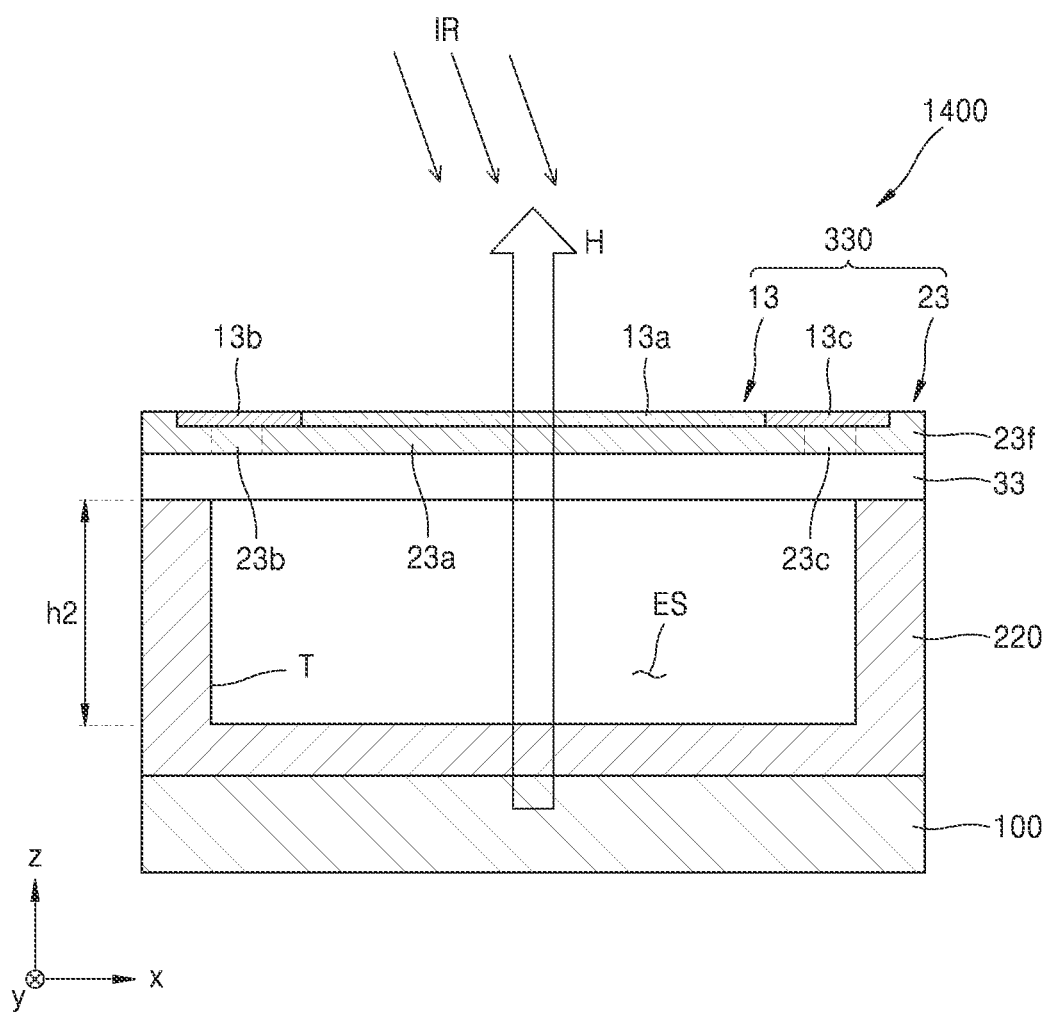
FIG. 21 is a view schematically illustrating an example configuration of a long-wave infrared detecting element according to another example embodiment.

FIG. 21 is a view schematically illustrating an example configuration of a long-wave infrared detecting element 1400 according to another example embodiment. The long-wave infrared detecting element 1400 shown in FIG. 21 may be substantially the same as the long-wave infrared detecting element 1300 shown in FIGS. 19 and 20 except that a magnetic field generator 100 is not exposed to the outside through a trench T. In the following description given with reference to FIG. 21, the same description as that given with reference to FIGS. 2 to 17, 19, and 20 will be omitted.

Referring to FIG. 21, the trench T may be provided in a substrate 220 by etching a portion of the substrate 220. An empty space ES may be formed inside the trench T. The trench T may not completely penetrate the substrate 220. Therefore, as shown in FIG. 21, the magnetic field generator 100 may be covered by the substrate 220 and thus may not be exposed to the outside. The depth h2 of the trench T may correspond to ¼ of the wavelength of infrared rays IR incident on an support unit 23. For example, when the wavelength of infrared rays incident on the support unit 23 is 10 µm, the depth h2 of the trench T may be about 2.5 µm. Therefore, the support unit 23 and the substrate 220 may be apart from each other by the depth h2 of the trench T. In this case, optical resonance may occur between the support unit 23 and the substrate 220, and absorption of infrared rays IR in the support unit 23 may be enhanced.

Figure 22:
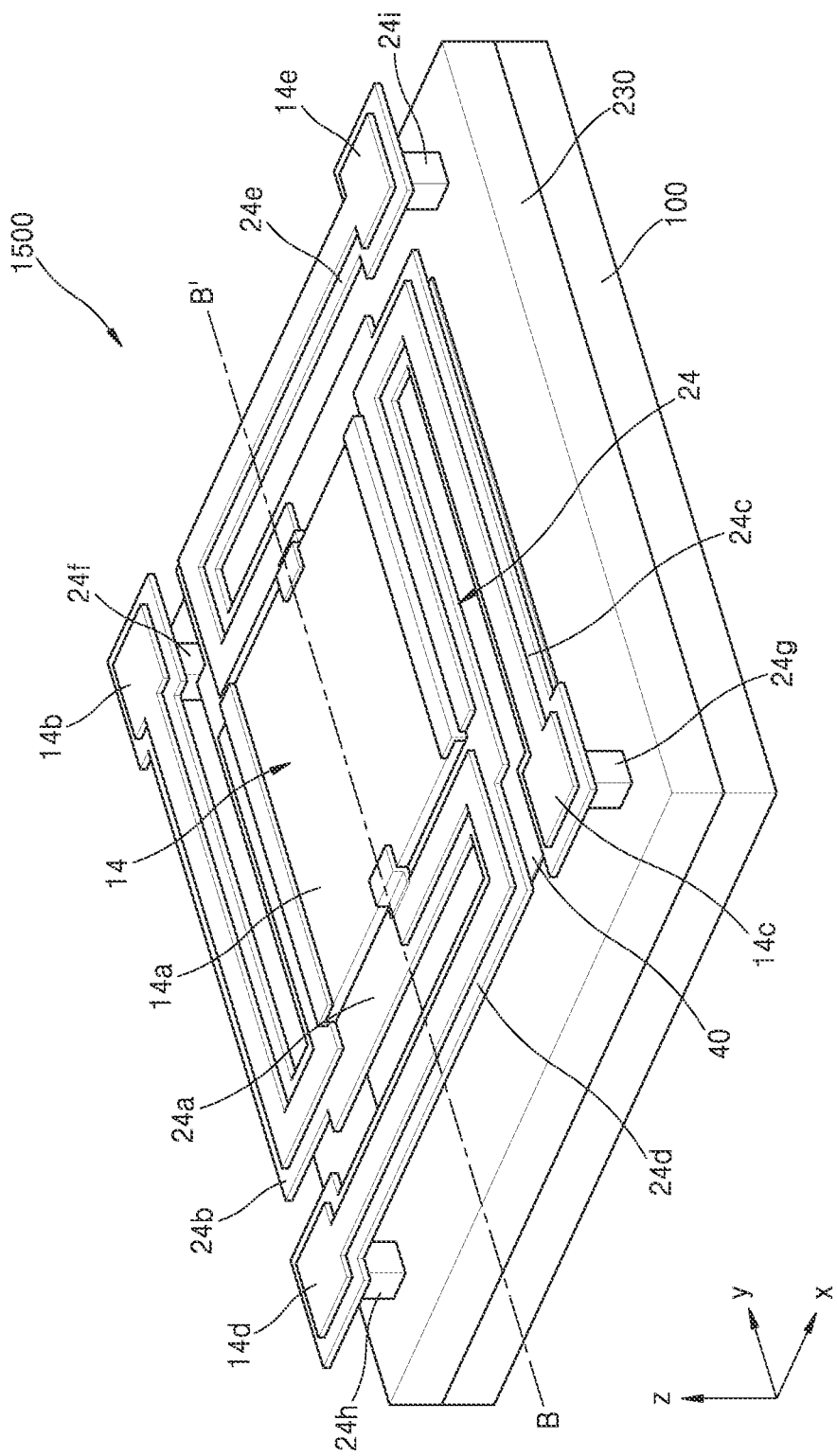
FIG. 22 is a view schematically illustrating an example configuration of a long-wave infrared detecting element according to another example embodiment.
Figure 23:
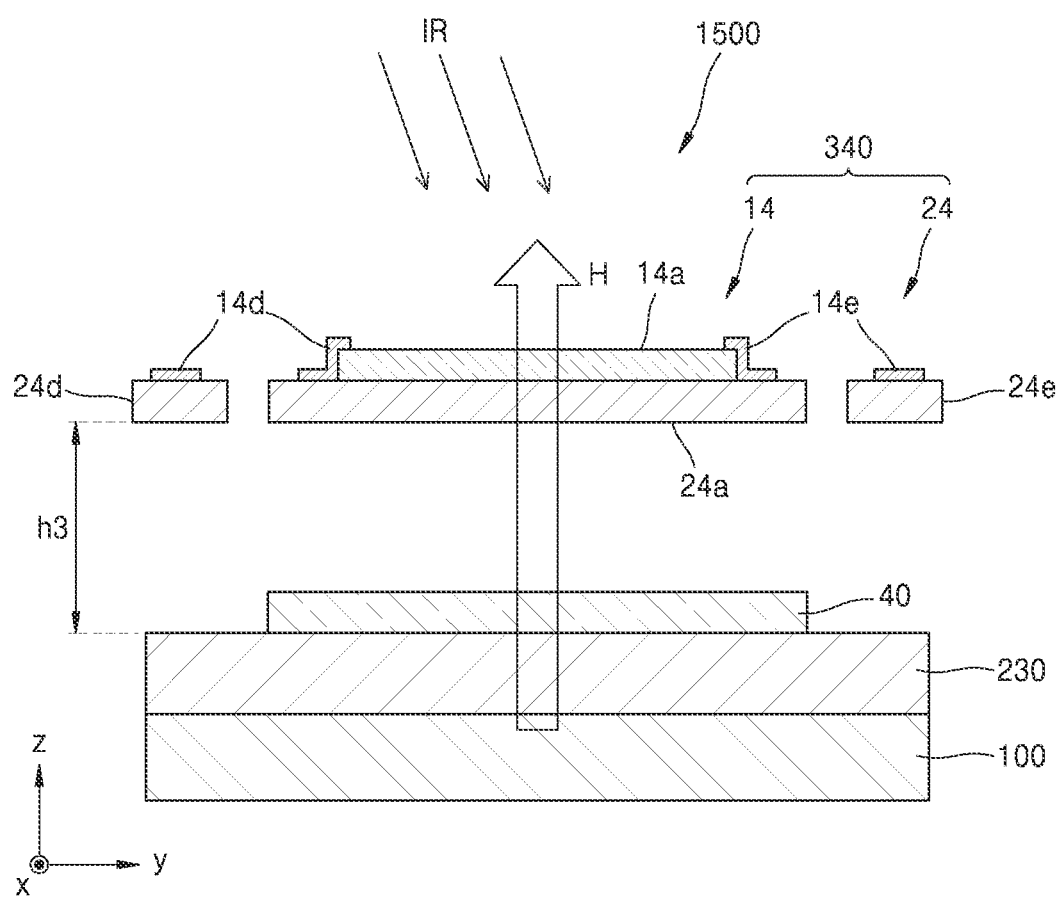
FIG. 23 is a schematic cross-sectional view taken along line B-B' of FIG. 22.

FIG. 22 is a view schematically illustrating an example configuration of a long-wave infrared detecting element 1500 according to another example embodiment. FIG. 23 is a schematic cross-sectional view taken along line B-B' of FIG. 22.

The functions of the magnetic-electric converter 14 shown in FIGS. 22 and 23 may be substantially the same as the functions of the magnetic-electric converter 11 shown in FIGS. 2 and 3. In the following description given with reference to FIGS. 22 and 23, the same description as that given with reference to FIGS. 2 to 18 will be omitted.

Referring to FIGS. 22 and 23, the long-wave infrared detecting element 1500 may include a magnetic field generator 100 that generates a magnetic field, a substrate 230 that is provided on the magnetic field generator, and a thermo-electromagnetic detector 340 that is provided on the substrate 230 to absorb infrared radiation incident from the outside and convert temperature changes caused by absorbing the infrared radiation into changes in an electrical signal. The magnetic field generator 100 and the substrate 230 are the same as those described with reference to FIG. 1. For example, the magnetic field generator 100 may generate a constant magnetic field H in a vertical direction (z-axis direction). The magnetic field H may pass through the substrate 230 and act on the thermo-electromagnetic detector 340. Hereinafter, the thermo-electromagnetic detector 340 will be described.

The thermo-electromagnetic detector 340 may include a magnetic-electric converter 14 that is arranged apart from the substrate 230 and generates an electrical signal according to a magnetic field H generated by the magnetic field generator 100, and an support unit 24 that is provided on the substrate 230 to support the magnetic-electric converter 14 apart from the substrate 200 and generate heat by absorbing infrared radiation from the outside.

The magnetic-electric converter 14 may generate an electrical signal according to a magnetic field H generated by the magnetic field generator 100. The magnetic-electric converter 14 may be apart from the substrate 230. For example, the magnetic-electric converter 14 may be provided on the support unit 24.

The magnetic-electric converter 14 may include a conductive Hall plate 14a; a pair of bias electrodes 14b and 14c that are provided at both ends of the Hall plate 14a in a first direction (x-axis direction), and at least one pair of detection electrodes 14d and 14e that are provided at both ends of the Hall plate 14a in a second direction (y-axis direction) perpendicular to the first direction (x-axis direction). In this case, both the first direction (x-axis direction) and the second direction (y-axis direction) may be perpendicular to the direction of a magnetic field H (z-axis direction) generated by the magnetic field generator 100.

When the Hall plate 14a includes a rectangular parallelepiped shape, the pair of bias electrodes 14b and 14c may cover two opposite edges of the Hall plate 14a in the first direction (x-axis direction). For example, the pair of bias electrodes 14b and 14c may extend in the second direction (y-axis direction) and cover the two opposite edges of the Hall plate 14a facing each other in the first direction (x-axis direction). The pair of bias electrodes 14b and 14c may be provided along a straight line parallel to the first direction (x-axis direction). In addition, the pair of bias electrodes 14b and 14c may have a stepped shape such that the pair of bias electrodes 14b and 14c may be in contact with portions of an upper surface of a support plate 24a (described later) while being respectively in contact with the two opposite edges of the Hall plate 11a in the first direction (x-axis direction).

Each of the pair of bias electrodes 14b and 14c may include a pattern extending from the Hall plate 14a. For example, each of the pair of bias electrodes 14b and 14c may include a meander pattern. Therefore, the pair of bias electrodes 14b and 14c may cover the two opposite edges of the Hall plate 14a in the first direction (x-axis direction) while each having a meander pattern extending from the Hall plate 14a. However, embodiments are not limited thereto, and each of the pair of bias electrodes 14b and 14c may include a bar pattern extending in one direction.

In this case, the pair of detection electrodes 14d and 14e may be respectively in contact with two opposite edges of the Hall plate 14a in the second direction (y-axis direction). The pair of detection electrodes 14d and 14e may be provided along a straight line parallel to the second direction (y-axis direction). Furthermore, each of the pair of detection electrodes 14d and 14e may include a pattern which extends from the Hall plate 14a while being in contact with the Hall plate 14a. For example, each of the pair of detection electrodes 14d and 14e may include a meander pattern. However, embodiments are not limited thereto, and each of the pair of detection electrodes 14d and 14e may include a bar pattern extending in one direction. The pair of detection electrodes 14d and 14e may have a stepped shape such that the pair of detection electrodes 14d and 14e may be in contact with portions of the upper surface of the support plate 24a (described later) while being respectively in contact with the two opposite edges of the Hall plate 11a in the second direction (y-axis direction).

The support unit 24 may include the support plate 24a that supports the Hall plate 14a, support pillars 24f, 24g, 24h, and 24i that protrude from an upper surface of the substrate 230 in the vertical direction (z-axis direction), and connection units 24b, 24c, 24d, and 24e that structurally connect the support plate 24a and each upper portions of the support pillars 24f, 24g, 24h, and 24i to each other.

The heights of the support pillars 24f, 24g, 24h, and 24i may correspond to ¼ of the wavelength of infrared rays IR incident on the support unit 24. For example, when the wavelength of infrared rays IR incident on the support unit 24 is 10 µm, the heights of the support pillars 24f, 24g, 24h, and 24i may be about 2.5 µm. Therefore, a separation distance h3 between the support unit 24 and the substrate 230 may correspond to ¼ of the wavelength of infrared rays IR incident on the support unit 24. In this case, optical resonance may occur between the support unit 24 and the substrate 230, and absorption of Infrared rays IR in the support unit 24 may be enhanced.

The support plate 24a and the support pillars 24f, 24g, 24h, and 24i may be spaced apart from each other on a plane perpendicular to the vertical direction (z-axis direction). For example, the support pillars 24f, 24g, 24h, and 24i may include first to fourth support pillars 24f, 24g, 24h, and 24i that are respectively provided in four corner regions of the upper surface of the substrate 230. In addition, for example, the connection units 24b, 24c, 24d, and 24e may include a first connection unit 24b connecting an upper portion of the first support pillar 24f and the support plate 24a to each other, a second connection unit 24c connecting an upper portion of the second support pillar 24g and the support plate 24a to each other, a third connection unit 24d connecting an upper portion of the third support pillar 24h and the support plate 24a to each other, and a fourth connection unit 24e connecting an upper portion of the fourth support pillar 24i and the support plate 24a to each other.

The support unit 24 may include the support plate 24a which has a rectangular upper surface. For example, the support plate 24a may have a rectangular parallelepiped shape. For example, the support plate 24a may have a thin plate shape. However, embodiments are not limited thereto, and for example, the support plate 24a may have various shapes other than the rectangular parallelepiped shape. In addition, the support plate 24a may support not only the Hall plate 14a, but also portions of the pair of bias electrodes 14b and 14c and the pair of detection electrodes 14d and 14e.

The support unit 24 may include the first connection unit 24b, the second connection unit 24c, the third connection unit 24d, and the fourth connection unit 24e which respectively support the pair of bias electrodes 14b and 14c and the pair of detection electrodes 14d and 14e. The first to fourth connection units 24b, 24c, 24d, and 24e may respectively support meander pattern regions of the pair of bias electrodes 14b and 14c and the pair of detection electrodes 14d and 14e. For example, the first to fourth connection units 24b, 24c, 24d, and 24e may include meander patters that respectively correspond to the pair of bias electrodes 14b and 14c and the pair of detection electrodes 14d and 14e. However, embodiments are not limited thereto, and for example, each of the first to fourth connection units 24b, 24c, 24d, and 24e may include a rod pattern extending in one direction. In addition, the area of the first to fourth connection units 24b, 24c, 24d, and 24e may be less than the area of the support plate 24a. Based on the structure of the support unit 24, that is, a thermal isolation structure, thermal energy resulting from infrared radiation may be efficiently transferred to the electro-magnetic converter 14, and as a result, infrared radiation may be efficiently converted into electrical energy.

The support unit 24 may include at least one selected from the group consisting of silicon oxide and silicon nitride. The silicon oxide may include, for example, $SiO_2$. The silicon nitride may include, for example, $Si_3N_4$. However, embodiments are not limited thereto, and the support unit 24 may include any material which has rigidity for supporting the magnetic-electric converter 14 and is capable of more efficiently absorbing thermal energy.

In addition, all of the support plate 24a, the connection units 24b, 24c, 24d, and 24e, and the support pillars 24f, 24g, 24h, and 24i may include at least one selected from the group consisting of silicon oxide and silicon nitride. In this case, the support plate 24a, the connection units 24b, 24c, 24d, and 24e, and the support pillars 24f, 24g, 24h, and 24i may be formed in one piece. However, embodiments are not limited thereto, and for example, the support plate 24a and the connection units 24b, 24c, 24d, 24e may be formed in one piece and the support pillars 24f, 24g, 24h, and 24i may be formed through a separate process.

As described above when the magnetic-electric converter 14 is spaced apart from the substrate 230 by a predetermined height due to the support unit 24, thermal energy may be more efficiently transferred to the magnetic-electric converter 14 than in the case in which the substrate 230 and the magnetic-electric converter 14 are in direct contact with each other.

In addition, the long-wave infrared detecting element 1500 may further include a reflecting plate 40 provided on the upper surface of the substrate 230. The reflecting plate 40 may be provided in a region corresponding to the support plate 24a. In addition, the area of the reflecting plate 40 may be equal to the area of the support plate 24a. The reflecting plate 40 may include a metal such as gold (Au) or aluminum (Al). However, embodiments are not limited thereto, and the reflecting plate 40 may include various materials having high reflectivity. Infrared rays IR incident from the outside may be reflected by the reflecting plate 40 toward the support unit 24. Therefore, infrared absorption in the support unit 24 may be enhanced. However, embodiments are not limited thereto, and the long-wave infrared detecting element 1500 may not include the reflecting plate 40.

Figure 24:
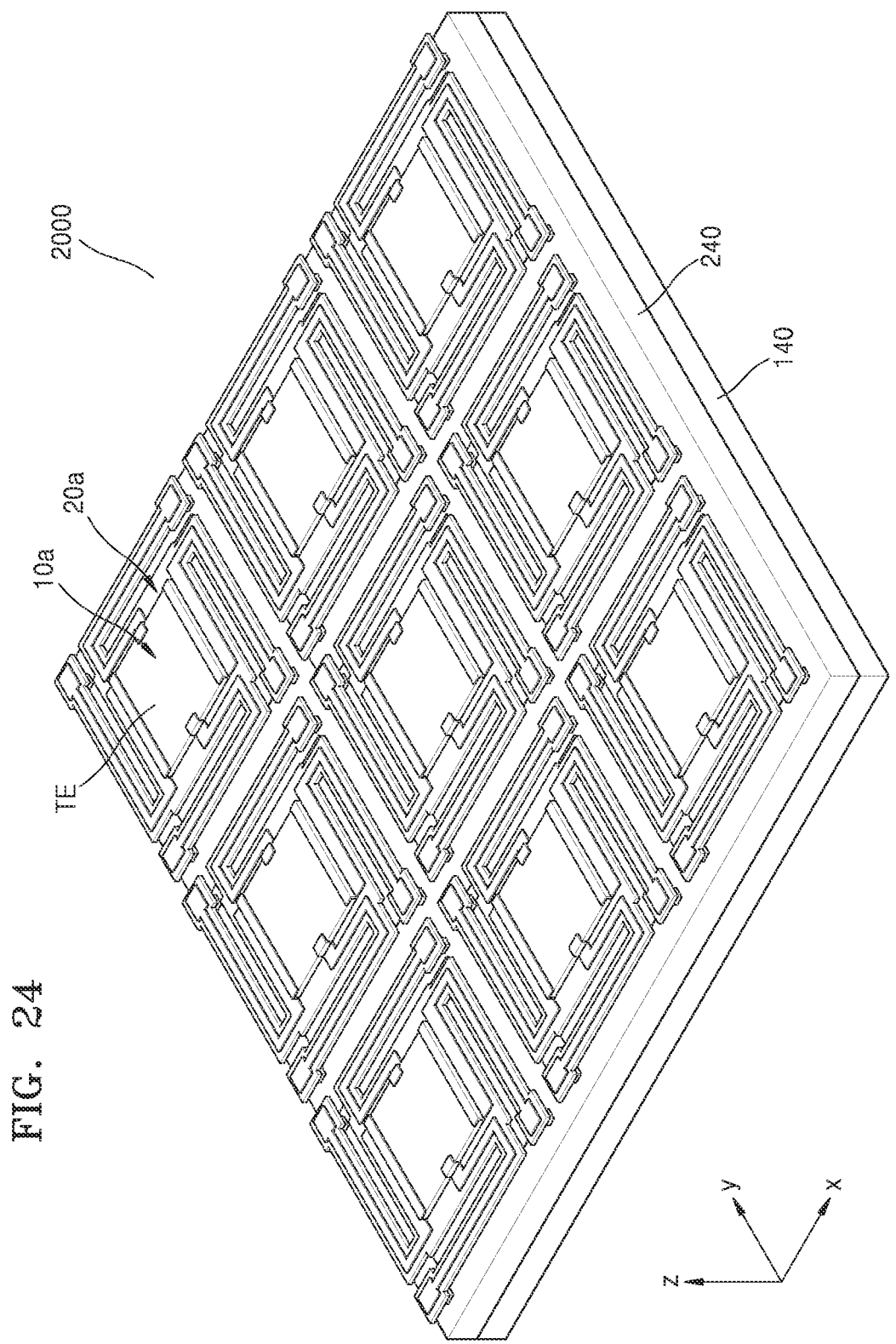
FIG. 24 is a perspective view schematically illustrating an example configuration of a long-wave infrared detecting element array structure according to an example embodiment.

FIG. 24 is a schematic perspective view illustrating an example configuration of a long-wave infrared detecting element array structure 2000 according to an example embodiment.

Referring to FIG. 24, the long-wave infrared detecting element array structure 2000 may include a plurality of long-wave infrared detecting elements TE. For example, the plurality of long-wave infrared detecting elements TE may be arranged in a predetermined pattern on a 2D plane. Although FIG. 24 shows nine long-wave infrared detecting elements TE, embodiments are not limited thereto, and the long-wave infrared detecting element array structure 2000 may include a large number of long-wave infrared detecting elements TE. For example, the long-wave infrared detecting element array structure 2000 may include 160×120 or 640× 480 long-wave infrared detecting elements TE.

Each of the plurality of long-wave infrared detecting elements TE may detect infrared radiation incident from outside by measuring an electrical signal, which vary with temperature changes caused by the incident infrared radiation, by using a magnetic-electric converter 10a provided on an support unit 20a. Each of the plurality of long-wave infrared detecting elements TE may include any one of the long-wave infrared detecting elements 1000, 1100, 1200, 1300, 1400, and 1500 described with reference to FIGS. 1 to 22. The magnetic field generator 140 and the substrate 240 included in the long-wave infrared detecting element array structure 2000 may be formed as on body.

Figure 25:
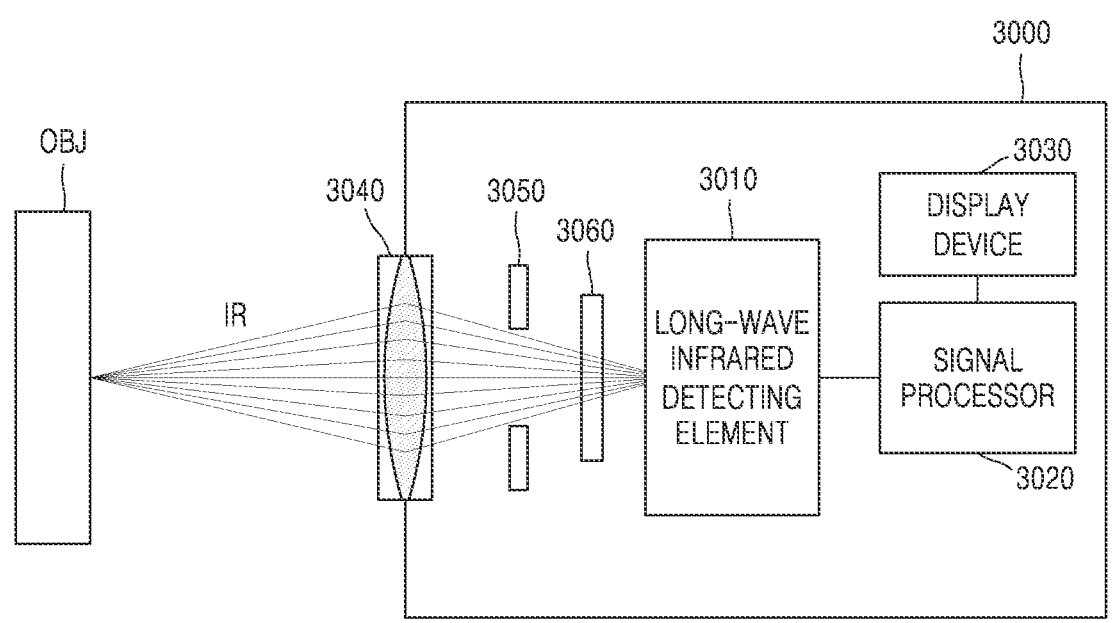
FIG. 25 is a view schematically illustrating an example configuration of a long-wave infrared temperature detecting device according to an example embodiment.

FIG. 25 is a schematic view illustrating an example configuration of a long-wave infrared temperature detecting device 3000 according to an example embodiment.

Referring to FIG. 25, the long-wave infrared temperature detecting device 3000 may include a long-wave infrared detecting element 3010 that absorbs infrared radiation emitted from an object OBJ and generates an electrical signal that changes according to the infrared radiation, a signal processor 3020 that processes the electrical signal received from the long-wave infrared detecting element 3010 to estimate the temperature of the object OBJ, and a display device 3030 that displays a temperature of the object OBJ.

The long-wave infrared detecting element 3010 may measure the amount of infrared radiation emitted from the object OBJ by measuring an electrical signal, which varies according to the infrared radiation, by using a magnetic-electric converter. The long-wave infrared detecting element 3010 may include any one of the long-wave infrared detecting elements 1000, 1100, 1200, 1300, 1400, and 1500 described with reference to FIGS. 1 to 23.

The long-wave infrared temperature detecting device 3000 may include an optical system configured to more efficiently transmit infrared rays IR to the long-wave infrared detecting element 3010. For example, the long-wave infrared temperature detecting device 3000 may include an optical lens 3040 that focuses incident infrared rays IR incident on the long-wave infrared detecting element 3010. The optical lens 3040 may include an infrared ray focusing lens. In addition, the long-wave infrared temperature detecting device 3000 may further include a aperture stop 3050 that is provided between the optical lens 3040 and the long-wave infrared detecting element 3010 to control the amount of infrared light (IR), and an optical filter 3060 that is provided between the optical lens 3040 and the long-wave infrared detecting element 3010 to selectively transmit the infrared radiation in a specific wavelength band that has passed through the optical lens 3040. For example, the optical filter 3050 may transmit the infrared rays IR in a wavelength band of about 8 μm to about 14 μm. However, embodiments are not limited thereto, and the wavelength pass band of the optical filter 3050 may be variously set.

The signal processor 3020 may process an electrical signal from the long-wave infrared detecting element 3010. For example, the signal processor 3020 may convert an analog signal from the long-wave infrared detecting element 3010 into a digital signal using an analog-to-digital converter (ADC). The signal processor 3020 may estimate the temperature of the object OBJ by comparing the amount of infrared radiation from the object OBJ measured by the long-wave infrared detecting element 3010 with the amount of radiation energy of a blackbody. A temperature signal processed by the signal processor 3020 may be transmitted to the display device 3030. The display device 3030 may display a temperature-indicating image by using the temperature signal received from the signal processor 3020.

The display device 3030 may include a liquid crystal display device, an organic light emitting display device, or the like. However, embodiments are not limited thereto, and for example, the display device 3030 may include any configuration for displaying images using electrical signals other than a liquid crystal display device and an organic light emitting display device.

Figure 26:
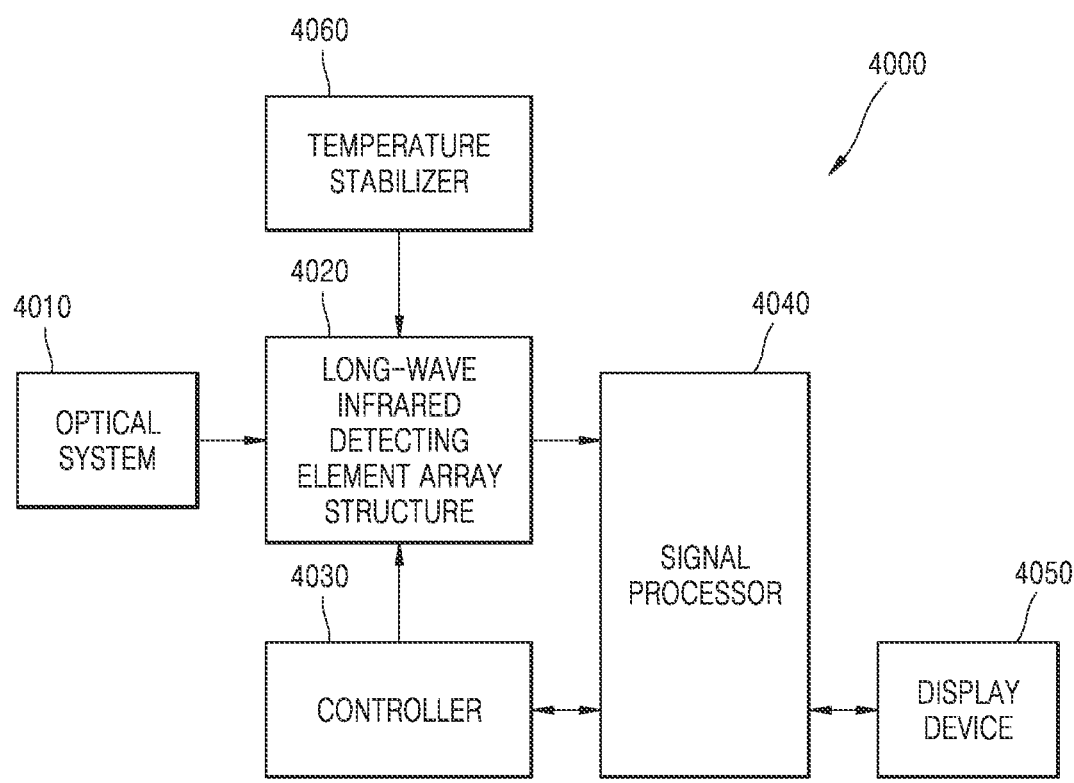
FIG. 26 is a view schematically illustrating an example configuration of a thermal imaging device according to an example embodiment.

FIG. 26 is a schematic block diagram including an example configuration of a thermal imaging device 4000 according to an example embodiment.

Referring to FIG. 26, the thermal imaging device 4000 may include an optical system 4010 that focuses infrared rays incident from the outside on a long-wave infrared detecting element array structure 4020, the long-wave infrared detecting element array structure 4020 that includes a plurality of long-wave infrared detecting elements configured to detect infrared rays passed through the optical system 4010, a controller 4030 that controls the operations of the plurality of long-wave infrared detecting elements included in the long-wave infrared detecting element array structure 4020, a signal processor 4040 that processes electrical signals from the long-wave infrared detecting element array structure 4020, and a display device 4050 that displays an image generated by electrical signals processed by the signal processor 4040.

The optical system 4010 may include, for example, an infrared optical lens. The infrared optical lens may focus infrared rays from the outside onto the long-wave infrared detecting element array structure 4020.

The long-wave infrared detecting element array structure 4020 may include the plurality of long-wave infrared detecting elements each configured to detect the amount of infrared radiation incident from the outside by measuring an electrical signal, which varies according to temperature changes caused by the infrared radiation, by using a magnetic-electric converter. The long-wave infrared detecting element array structure 4020 may include the long-wave infrared detecting element array structure 2000 described with reference to FIG. 24. Each of the plurality of long-wave infrared detecting elements included in the long-wave infrared detecting element array structure 4020 may form one pixel. Therefore, the long-wave infrared detecting element array structure 4020 may include a plurality of pixels. The plurality of pixels of the long-wave infrared detecting element array structure 4020 may respectively correspond to a plurality of pixels included in the display device 4050.

The controller 4030 may control the operation of the long-wave infrared detecting element array structure 4020. For example, application of a current signal or a voltage signal to each of the plurality of long-wave infrared detecting elements included in the long-wave infrared detecting element array structure 4020 may be independently controlled. Therefore, the plurality of long-wave infrared detecting elements included in the long-wave infrared detecting element array structure 4020 may be sequentially driven. However, embodiments are not limited thereto, and the controller 4030 may variously control driving of the plurality of long-wave infrared detecting elements included in the long-wave infrared detecting element array structure 4020.

The controller 4030 may include, for example, a central processing unit, a microprocessor, a graphic processing unit, an application specific integrated circuit (ASIC), a digital signal processor (DSP), a digital signal processing device (DSPD), a programmable Logic device (PLD), or a field programmable gate array (FPGA), but the controller 4030 is not limited thereto.

The signal processor 4040 may process an electrical signal from the long-wave infrared detecting element array structure 4020. For example, the signal processor 4020 may convert an analog signal received from the long-wave infrared detecting element array structure 4020 into a digital signal by using an analog-to-digital converter (ADC). In addition, the signal processing operation of the signal processor 4040 may be a basis on which the controller 4030 controls the long-wave infrared detecting element array structure 4020. For example, the manner in which the controller 4030 controls the long-wave infrared detecting element array structure 4020 may be determined according to the manner in which the signal processor 4040 processes signals. In addition, the signal processing operation of the signal processor 4040 may be controlled by the controller 4030. A signal processed by the signal processor 4040 may be transmitted to the display device 4050. The display device 4050 may display an image indicating the temperature of an object by using a signal from the signal processor 4040.

The display device 4050 may include a liquid crystal display device, an organic light emitting display device, or the like. However, embodiments are not limited thereto, and the display device 4050 may include any configuration for displaying images using electrical signals other than a liquid crystal display device and an organic light emitting display device.

The thermal imaging device 4000 may further a temperature stabilizer 4060 which is configured to keep the ambient temperature constant such that the long-wave infrared detecting element array structure 4020 may operate at a constant temperature, For example, the temperature stabilizer 4060 may be provided under a magnetic field generator of the plurality of long-wave infrared detecting elements of the long-wave infrared detecting element array structure 4020.

The above-described various embodiments are merely examples, and those skilled in the art may understand that various modifications and equivalent other embodiments may be possible therefrom. Therefore, the scope of the present disclosure should be defined by the following claims.

As described above, according to the one or more of the above example embodiments, it may be possible to provide a long-wave infrared detecting element, a long-wave infrared detecting element array structure, a long-wave infrared temperature detecting device, and a thermal imaging device that are miniaturized using a thermo-electromagnetic detector which is configured to detect an electrical signal varying according to changes in the amount of infrared radiation absorbed in a state in which a magnetic field is applied to the thermo-electromagnetic detector.

As described above, according to the one or more of the above example embodiments, it may be possible to provide a long-wave infrared detecting element, a long-wave infrared detecting element array structure, a long-wave infrared temperature detecting device, and a thermal imaging device that are configured to generate an electrical signal that changes according to infrared radiation absorbed at room temperature by adjusting the concentration or ionization energy of a dopant implanted into a Hall plate which is included in a thermo-electromagnetic detector and has an extrinsic semiconductor material.

As described above, according to the one or more of the above embodiments, it may be possible to provide a long-wave infrared detecting element capable of detecting long-wave infrared rays in real time owing to a structure in which infrared radiation absorbed in a thermo-electromagnetic detector is efficiently converted into electrical energy, a long-wave infrared detecting element array structure including the long-wave infrared detecting element, a long-wave infrared temperature detecting device including the long-wave infrared detecting element, and a thermal imaging device including the long-wave infrared detecting element.

It should be understood that example embodiments described herein should be considered in a descriptive sense only and not for purposes of limitation. Descriptions of features or aspects within each example embodiment should typically be considered as available for other similar features or aspects in other embodiments. While example embodiments have been described with reference to the figures, it will be understood by those of ordinary skill in the art that various changes in form and details may be made therein without departing from the spirit and scope as defined by the following claims and their equivalents.

What is claimed is:

1. A long-wave infrared detecting element comprising:
a magnetic field generator configured to generate a magnetic field;
a substrate provided on the magnetic field generator;
a magnetic-electric converter that is spaced apart from the substrate and configured to generate an electrical signal based on the magnetic field generated by the magnetic field generator; and
an support unit that is provided on the substrate and supports the magnetic-electric converter in a state in which the magnetic-electric converter is spaced apart from the substrate, the support unit being configured to generate heat by absorbing incident infrared radiation, wherein the electrical signal changes corresponding to temperature changes of the magnetic-electric converter based on the incident infrared radiation directly absorbed in the magnetic-electric converter and temperature changes of the magnetic-electric converter based on the incident infrared radiation absorbed in the support unit.

2. The long-wave infrared detecting element of claim 1, wherein the magnetic-electric converter comprises:
a Hall plate which is conductive;
a pair of bias electrodes which are provided at both ends of the Hall plate in a first direction of the Hall plate; and
at least one pair of detection electrodes which are provided at both ends of the Hall plate in a second direction of the Hall plate which is perpendicular to the first direction,
wherein both the first direction and the second direction are perpendicular to a direction of the magnetic field generated by the magnetic field generator.

3. The long-wave infrared detecting element of claim 2, wherein the Hall plate comprises an extrinsic semiconductor material doped with a dopant.

4. The long-wave infrared detecting element of claim 3, wherein in a voltage bias mode in which a constant voltage is applied between the pair of bias electrodes, Hall voltage generated in the Hall plate decreases as a temperature of the Hall plate increases.

5. The long-wave infrared detecting element of claim 3, wherein a concentration of the dopant is determined such that in a voltage bias mode in which a constant voltage is applied between the pair of bias electrodes, a rate of change in temperature-dependent Hall voltage generated in the Hall plate is within a range of −0.5%/K to −1.0%/K at room temperature.

6. The long-wave infrared detecting element of claim 5, wherein the concentration of the dopant is determined such that the Hall plate has a resistance value of 800Ω to 7000 kΩ at room temperature.

7. The long-wave infrared detecting element of claim 3, wherein ionization energy of the dopant is determined such that in a current bias mode in which a constant current is applied between the pair of bias electrodes, Hall voltage generated in the Hall plate decreases as a temperature of the Hall plate increases in a temperature range of 250 K to 400 K.

8. The long-wave infrared detecting element of claim 7, wherein the ionization energy of the dopant is determined such that in the current bias mode in which a constant current is applied between the pair of bias electrodes, a rate of change in temperature-dependent Hall voltage generated in the Hall plate is within a range of −1.0%/K to −2.0%/K at room temperature.

9. The long-wave infrared detecting element of claim 7, wherein the concentration of the dopant is within a range of $10^{12}$ cm$^{-3}$ to $10^{17}$ cm$^{-3}$.

10. The long-wave infrared detecting element of claim 2, wherein a trench is provided in a portion of the substrate, and the Hall plate is provided above the trench.

11. The long-wave infrared detecting element of claim 10, wherein the support unit comprises:
a support plate provided above the trench to support the Hall plate;
an edge element spaced apart from the support plate and adjacent to the support plate; and
at least one connection unit connecting the support plate and the edge element to each other.

12. The long-wave infrared detecting element of claim 11, wherein each of the pair of bias electrodes and the at least one pair of detection electrodes extend in a direction away from the Hall plate, and
wherein the at least one connection unit comprises a first connection unit, a second connection unit, a third connection unit, and a fourth connection unit which respectively support the pair of bias electrodes and the at least one pair of detection electrodes.

13. The long-wave infrared detecting element of claim 11, wherein the support plate comprises any one of silicon nitride and silicon oxide.

14. The long-wave infrared detecting element of claim 12, wherein the Hall plate is provided in a region of the support plate, and
wherein the pair of bias electrodes and the at least one pair of detection electrodes are provided in regions of the support plate, the first to fourth connection units, and the edge element.

15. The long-wave infrared detecting element of claim 14, wherein the Hall plate is formed by doping the region of the support plate with a dopant.

16. The long-wave infrared detecting element of claim 14, further comprising an insulating layer provided between the support unit and the substrate.

17. The long-wave infrared detecting element of claim 2, wherein the support unit comprises:
a support plate supporting the Hall plate;
a support pillar protruding from an upper surface of the substrate in a vertical direction; and
a connection unit connecting the support plate and an upper portion of the support pillar to each other,
wherein the support plate and the support pillar are spaced apart from each other on a plane perpendicular to the vertical direction.

18. The long-wave infrared detecting element of claim 17, wherein the pair of bias electrodes and the at least one pair of detection electrodes comprise a pattern extending from the Hall plate,
wherein the connection unit comprises a first connection unit, a second connection unit, a third connection unit, and a fourth connection unit which respectively support the pair of bias electrodes and the at least one pair of detection electrodes, and
wherein the support pillar comprises a first support pillar, a second support pillar, a third support pillar, and a fourth support pillar which are respectively connected to the first connection unit, the second connection unit, the third connection unit, and the fourth connection unit.

19. The long-wave infrared detecting element of claim 18, wherein the pair of bias electrodes and the at least one pair of detection electrodes comprise a meander pattern.

20. The long-wave infrared detecting element of claim 17, wherein the connection unit has an area less than an area of the support plate.

21. The long-wave infrared detecting element of claim 17, further comprising a reflecting plate provided on the upper surface of the substrate.

22. The long-wave infrared detecting element of claim 2, further comprising a reference converter which comprises:
a conductive reference plate;
an infrared shield layer provided on the reference plate;
a pair of bias electrodes provided at both ends of the reference plate in a first direction of the reference plate; and at least one pair of detection electrodes provided at both ends of the reference plate in a second direction of the reference plate which is perpendicular to the first direction, wherein both the first direction and the second direction are perpendicular to the direction of the magnetic field generated by the magnetic field generator, and wherein electrical signals produced by the magnetic-electric converter and the reference converter are differentially amplified by a differential amplifier circuit.

23. A long-wave infrared detecting element array structure comprising a plurality of long-wave infrared detecting elements, wherein each of the plurality of long-wave infrared detecting elements comprises:

a magnetic field generator configured to generate a magnetic field;

a substrate provided on the magnetic field generator;

a magnetic-electric converter that is spaced apart from the substrate and configured to generate an electrical signal based on the magnetic field generated by the magnetic field generator; and an support unit that is provided on the substrate and supports the magnetic-electric converter in a state in which the magnetic-electric converter is spaced apart from the substrate, the support unit being configured to generate heat by absorbing incident infrared radiation, wherein the electrical signal changes corresponding to temperature changes of the magnetic-electric converter based on the incident infrared radiation directly absorbed in the magnetic-electric converter and temperature changes of the magnetic-electric converter based on the incident infrared radiation absorbed in the support unit.

24. The long-wave infrared detecting element array structure of claim 23, wherein the magnetic field generator and the substrate are provided in one piece.

25. A long-wave infrared temperature detecting device comprising:

a long-wave infrared detecting element configured to absorb incident infrared radiation and detect an electrical signal varying based on the incident infrared radiation;

a signal processor configured to process the electrical signal received from the long-wave infrared detecting element; and a display device configured to display an image generated by the electrical signal processed by the signal processor, wherein the long-wave infrared detecting element comprises:

a magnetic field generator configured to generate a magnetic field;

a substrate provided on the magnetic field generator;

a magnetic-electric converter that is spaced apart from the substrate and configured to generate the electrical signal based on the magnetic field generated by the magnetic field generator; and an support unit that is provided on the substrate and supports the magnetic-electric converter in a state in which the magnetic-electric converter is spaced apart from the substrate, the support unit is configured to generate heat by absorbing the incident infrared radiation, wherein the electrical signal changes corresponding to temperature changes of the magnetic-electric converter based on the incident infrared radiation directly absorbed in the magnetic-electric converter and temperature changes of the magnetic-electric converter based on the incident infrared radiation absorbed in the support unit.

26. The long-wave infrared temperature detecting device of claim 25, further comprising:

an optical lens that focuses incident infrared light on the long-wave infrared detecting element;

an aperture that is provided between the optical lens and the long-wave infrared detecting element and adjusts an amount of the infrared light; and an optical filter that is provided between the optical lens and the long-wave infrared detecting element and configured to remove a wavelength region of the infrared light having passed through the optical lens.

27. A thermal imaging device comprising:

an optical system configured to focus incident infrared rays;

a long-wave infrared detecting element array structure that comprises a plurality of long-wave infrared detecting elements configured to detect the infrared rays that passes through the optical system;

a controller configured to control operations of the plurality of long-wave infrared detecting elements;

a signal processor configured to process an electrical signal from the long-wave infrared detecting element array structure; and a display device configured to display an image generated by the electrical signal processed by the signal processor, wherein each of the plurality of long-wave infrared detecting elements comprises:

a magnetic field generator configured to generate a magnetic field;

a substrate provided on the magnetic field generator;

a magnetic-electric converter that is spaced apart from the substrate and configured to generate an electrical signal based on the magnetic field generated by the magnetic field generator; and an support unit that is provided on the substrate and supports the magnetic-electric converter in a state in which the magnetic-electric converter is spaced apart from the substrate, the support unit being configured to generate heat by absorbing incident infrared radiation, wherein the electrical signal changes corresponding to temperature changes of the magnetic-electric converter based on the incident infrared radiation directly absorbed in the magnetic-electric converter and temperature changes of the magnetic-electric converter based on the incident infrared radiation absorbed in the support unit.

* * * * *